US011676861B1

(12) United States Patent
Liao et al.

(10) Patent No.: US 11,676,861 B1
(45) Date of Patent: Jun. 13, 2023

(54) METHOD FOR FABRICATING SEMICONDUCTOR DEVICE

(71) Applicant: NANYA TECHNOLOGY CORPORATION, New Taipei (TW)

(72) Inventors: Che-Hsien Liao, New Taipei (TW); Yu-Chang Chang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 11 days.

(21) Appl. No.: 17/578,875

(22) Filed: Jan. 19, 2022

(51) Int. Cl.
*H01L 21/768* (2006.01)
*H10B 12/00* (2023.01)

(52) U.S. Cl.
CPC .. *H01L 21/76856* (2013.01); *H01L 21/76843* (2013.01); *H01L 21/76871* (2013.01); *H10B 12/488* (2023.02)

(58) Field of Classification Search
CPC ......... H01L 21/76856; H01L 21/76843; H01L 21/76871; H10B 12/488
See application file for complete search history.

(56) References Cited

U.S. PATENT DOCUMENTS

2016/0233220 A1\* 8/2016 Danek .................... H10B 43/27

\* cited by examiner

*Primary Examiner* — Thanhha S Pham
(74) *Attorney, Agent, or Firm* — Muncy, Geissler, Olds & Lowe, P.C.

(57) ABSTRACT

The present application discloses method for fabricating a semiconductor device. The method includes providing a substrate; forming a word line trench in the substrate; conformally forming a first insulating layer in the word line trench and conformity forming a first barrier layer on the first insulating layer; conformally forming a first nucleation layer on the first barrier layer; performing a post-treatment to the first nucleation layer, wherein the post-treatment comprises a reducing agent comprising diborane and a tungsten-containing precursor; forming a first bulk layer on the first nucleation layer, wherein the first nucleation layer and the first bulk layer configure a first conductive layer; and performing a planarization process to turn the first insulating layer, the first barrier layer, and the first conductive layer into a word line insulating layer, a word line barrier layer, and a word line conductive layer, respectively and correspondingly.

12 Claims, 19 Drawing Sheets

METHOD FOR FABRICATING SEMICONDUCTOR DEVICE

TECHNICAL FIELD

The present disclosure relates to a method for fabricating a semiconductor device, and more particularly, to a method including a post-treatment for fabricating the semiconductor device.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a conductive feature of a semiconductor device including providing a substrate; forming a recess in the substrate; conformally forming a first nucleation layer in the recess; performing a post-treatment to the first nucleation layer; and forming a first bulk layer on the first nucleation layer to fill the recess. The first nucleation layer and the first bulk layer configure the conductive feature. The first nucleation layer and the first bulk layer include tungsten. The post-treatment includes a borane-containing reducing agent.

Another aspect of the present disclosure provides a method for fabricating a semiconductor device including providing a substrate; forming a word line trench in the substrate; conformally forming a first insulating layer in the word line trench and conformally forming a first barrier layer on the first insulating layer; conformally forming a first nucleation layer on the first barrier layer; performing a post-treatment to the first nucleation layer, wherein the post-treatment includes a reducing agent including diborane; forming a first bulk layer on the first nucleation layer, wherein the first nucleation layer and the first bulk layer configure a first conductive layer; and performing a planarization process to turn the first insulating layer, the first barrier layer, and the first conductive layer into a word line insulating layer, a word line barrier layer, and a word line conductive layer, respectively and correspondingly, wherein the word line insulating layer, the word line barrier layer, and the word line conductive layer configure a word line structure. The first nucleation layer and the first bulk layer include tungsten.

Another aspect of the present disclosure provides a method for fabricating a semiconductor device including providing a substrate; forming a word line trench in the substrate; conformally forming a first insulating layer in the word line trench and conformally forming a first barrier layer on the first insulating layer; conformally forming a first nucleation layer on the first barrier layer; performing a post-treatment to the first nucleation layer, wherein the post-treatment includes a reducing agent including diborane and a tungsten-containing precursor; forming a first bulk layer on the first nucleation layer, wherein the first nucleation layer and the first bulk layer configure a first conductive layer; and performing a planarization process to turn the first insulating layer, the first barrier layer, and the first conductive layer into a word line insulating layer, a word line barrier layer, and a word line conductive layer, respectively and correspondingly, wherein the word line insulating layer, the word line barrier layer, and the word line conductive layer configure a word line structure. The first nucleation layer and the first bulk layer include tungsten.

Due to the design of the method for fabricating the semiconductor device of the present disclosure, the word line conductive layer may have tungsten with greater grain size and improved resistivity by employing the post-treatment to the nucleation portion of the word line conductive layer. In addition, the resistivity of the word line conductive layer may be improved by using the word line intervening layer formed of amorphous tungsten silicide to avoid the adverse columnar grain structure effect of the word line barrier layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
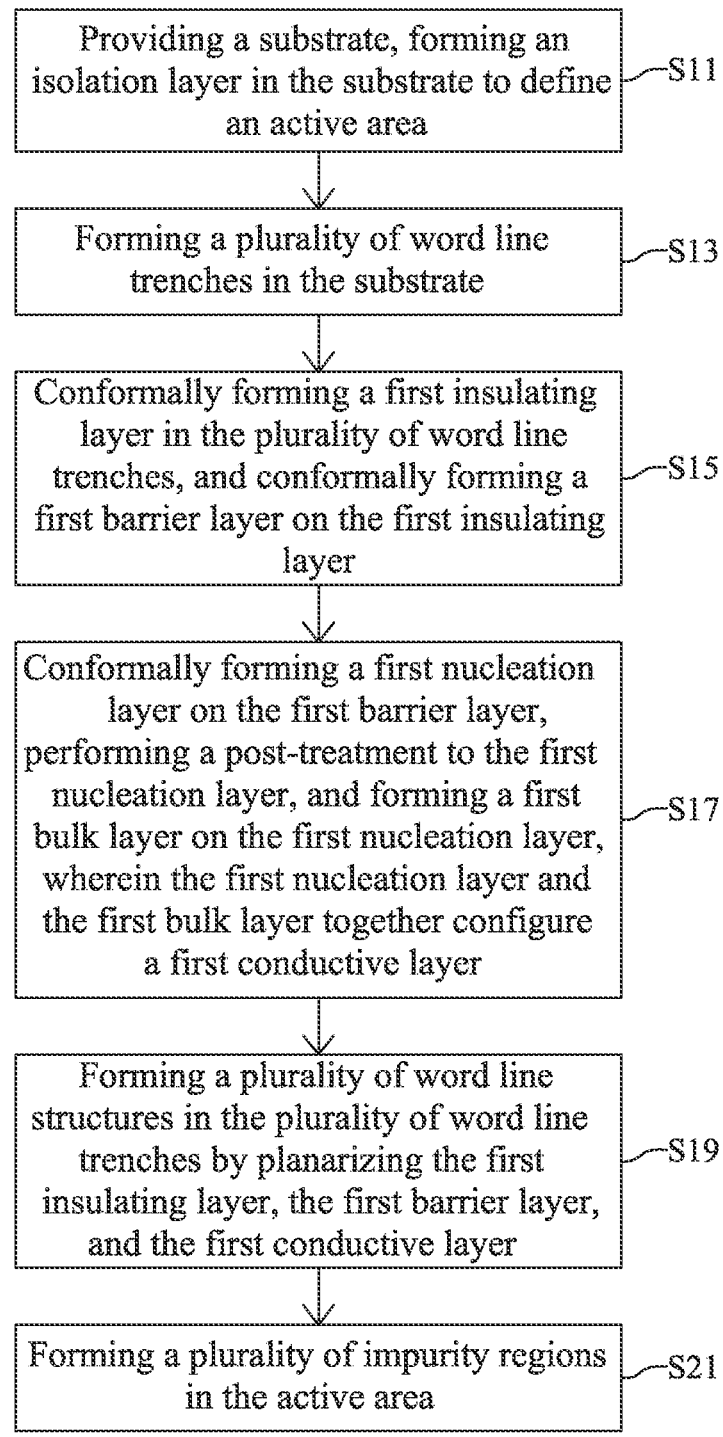
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
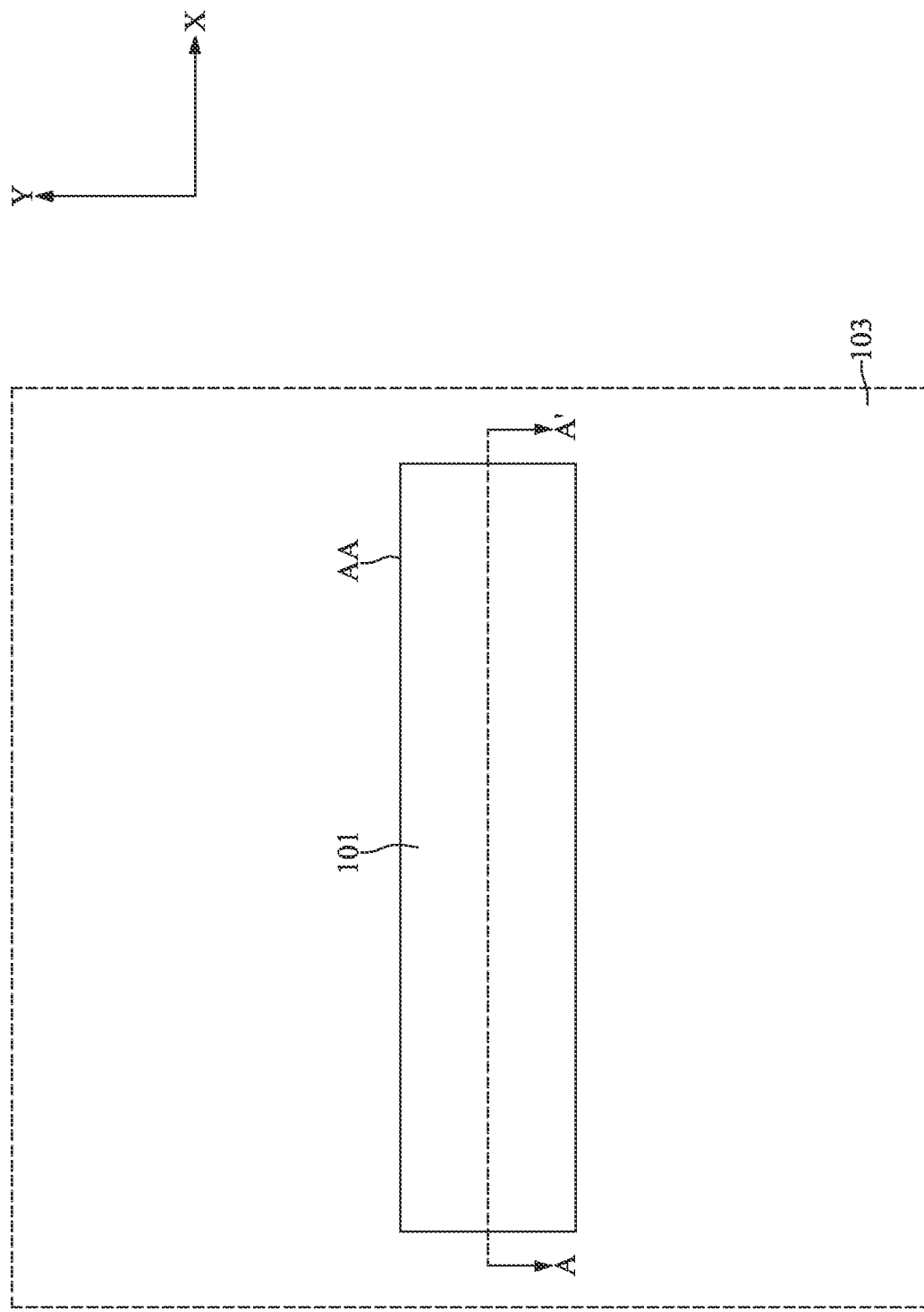
FIG. 2 illustrates, in a schematic top-view diagram, part of a flow for fabricating the semiconductor device in accordance with one embodiment of the present disclosure.
Figure 3:
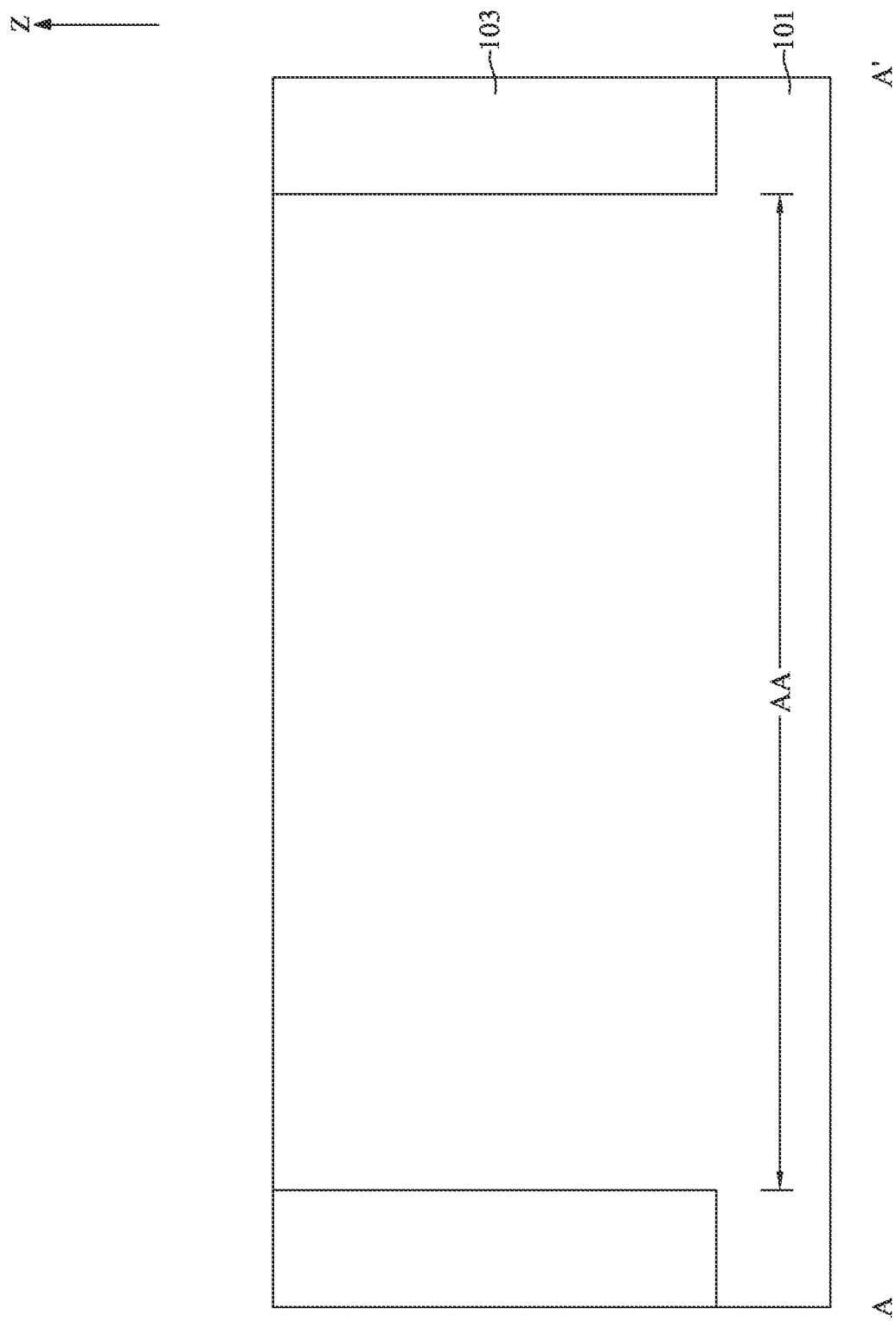
FIG. 3 is a schematic cross-sectional view diagram taken along a line A-A' in FIG. 2 illustrating part of the flow for fabricating the semiconductor device 1A in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, part of a flow for fabricating the semiconductor device 1A in accordance with one embodiment of the present disclosure. FIG. 3 is a schematic cross-sectional view diagram taken along a line A-A' in FIG. 2 illustrating part of the flow for fabricating the semiconductor device 1A in accordance with one embodiment of the present disclosure.

With reference to FIGS. 1 to 3, at step S11, a substrate 101 may be provided, an isolation layer 103 may be formed in the substrate 101 to define an active area AA.

With reference to FIGS. 2 and 3, the substrate 101 may include a silicon-containing material. Illustrative examples of silicon-containing materials suitable for the substrate 101 may include, but are not limited to, silicon, silicon germanium, carbon doped silicon germanium, silicon germanium carbide, carbon-doped silicon, silicon carbide, and multi-layers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

A series of deposition processes may be performed to deposit a pad oxide layer (not shown) and a pad nitride layer (not shown) on the substrate 101. A photolithography process may be performed to define the position of the isolation layer 103 by forming a mask layer (not shown) on the pad nitride layer. After the photolithography process, an etch process, such as an anisotropic dry etch process, may be performed to form a trench (not shown) penetrating along the pad nitride layer and the pad oxide layer, and extending to the substrate 101. An insulating material may be deposited into the trench. A planarization process, such as chemical mechanical polishing, may be subsequently performed to remove excess filling material until the top surface of the substrate 101 is exposed so as to form the isolation layer 103. The top surface of the isolation layer 103 and the top surface of the substrate 101 may be substantially coplanar. The insulating material may be, for example, silicon oxide, silicon nitride, silicon oxynitride, silicon nitride oxide, or fluoride-doped silicate.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 2 and 3, the portion of the substrate 101 surrounded by the isolation layer 103 may be referred to as the active area AA. In some embodiments, the active area AA may extend along the direction X in a top-view perspective. In some embodiments, the active area AA may extend along the direction Y in a top-view perspective (not shown). In some embodiments, the active area AA may extend along a direction slanted with respect to the direction X and the direction Y (not shown).

It should be noted that the active area AA may comprise a portion of the substrate 101 and a space above the portion of the substrate 101. Describing an element as being disposed on the active area AA means that the element is disposed on a top surface of the portion of the substrate 101. Describing an element as being disposed in the active area AA means that the element is disposed in the portion of the substrate 101; however, a top surface of the element may be even with the top surface of the portion of the substrate 101. Describing an element as being disposed above the active area AA means that the element is disposed above the top surface of the portion of the substrate 101.

Figure 4:
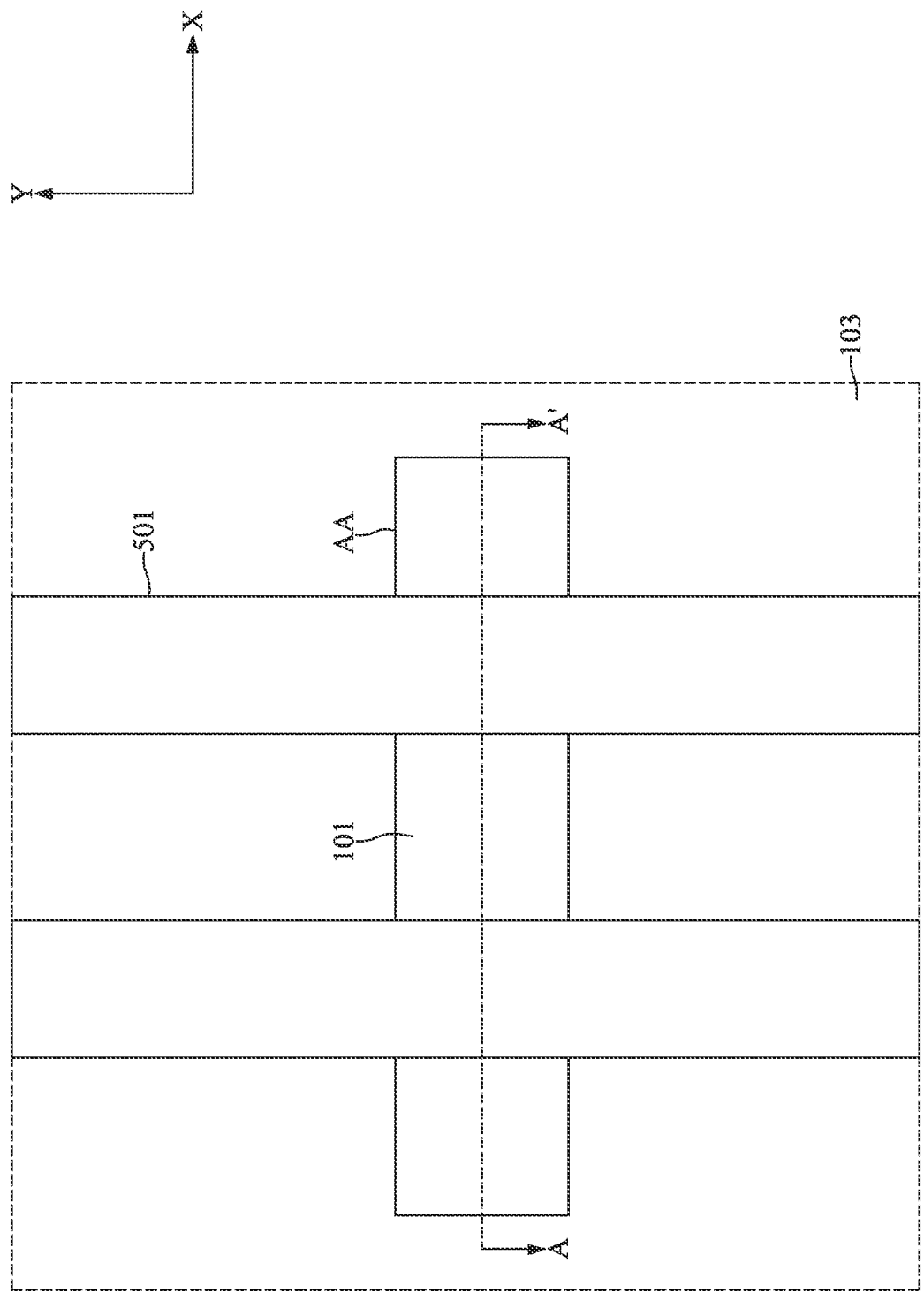
FIG. 4 illustrates, in a schematic top-view diagram, part of the flow for fabricating the semiconductor device in accordance with one embodiment of the present disclosure.

FIG. 4 illustrates, in a schematic top-view diagram, part of the flow for fabricating the semiconductor device 1A in accordance with one embodiment of the present disclosure. FIGS. 5 to 9 are schematic cross-sectional view diagrams taken along a line A-A' in FIG. 4 illustrating part of the flow for fabricating the semiconductor device 1A in accordance with one embodiment of the present disclosure.

Figure 5:
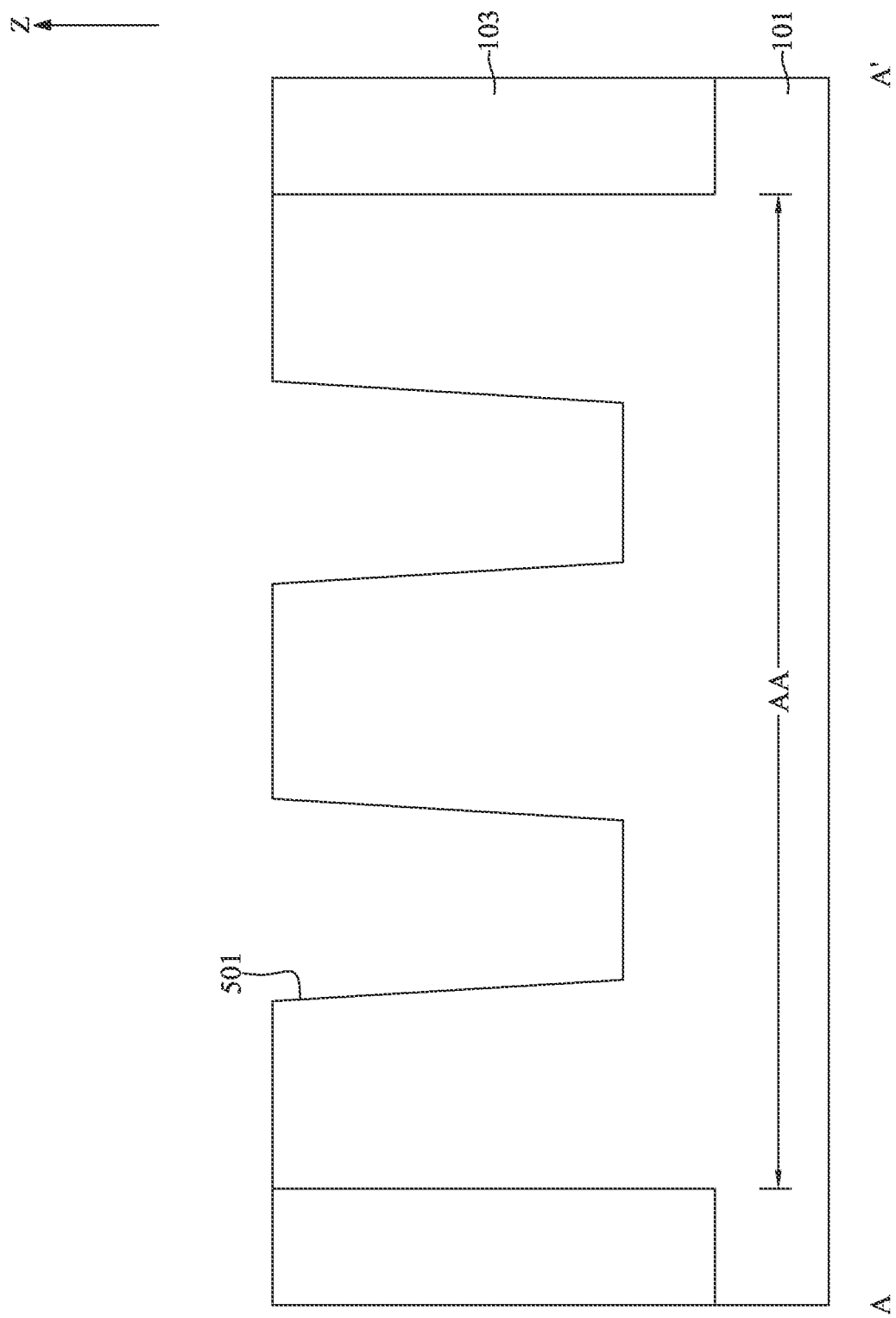
FIGS. 5 to 8 are schematic cross-sectional view diagrams taken along a line A-A' in FIG. 4 illustrating part of the flow for fabricating the semiconductor device in accordance with one embodiment of the present disclosure.

With reference to FIGS. 1, 4, and 5, at step S13, a plurality of word line trenches 501 may be formed in the substrate 101.

With reference to FIGS. 4 and 5, the plurality of word line trenches 501 may be formed in the substrate 101 and the isolation layer 103. The plurality of word line trenches 501 may be formed by an etch process using a mask pattern (not shown for clarity) formed on the substrate 101 and the isolation layer 103 as an etch mask. In some embodiments, the plurality of word line trenches 501 may have a line shape extending along the direction Y and traversing the active area AA. For example, the active area AA may be intersected with two word line trenches 501. The active area AA may be divided into three parts by the two word line trenches 501. In some embodiments, the aspect ratio of the word line trenches 501 may be at least 10:1, at least 15:1, at least 20:1, at least 25:1 or at least 30:1.

Figure 6:
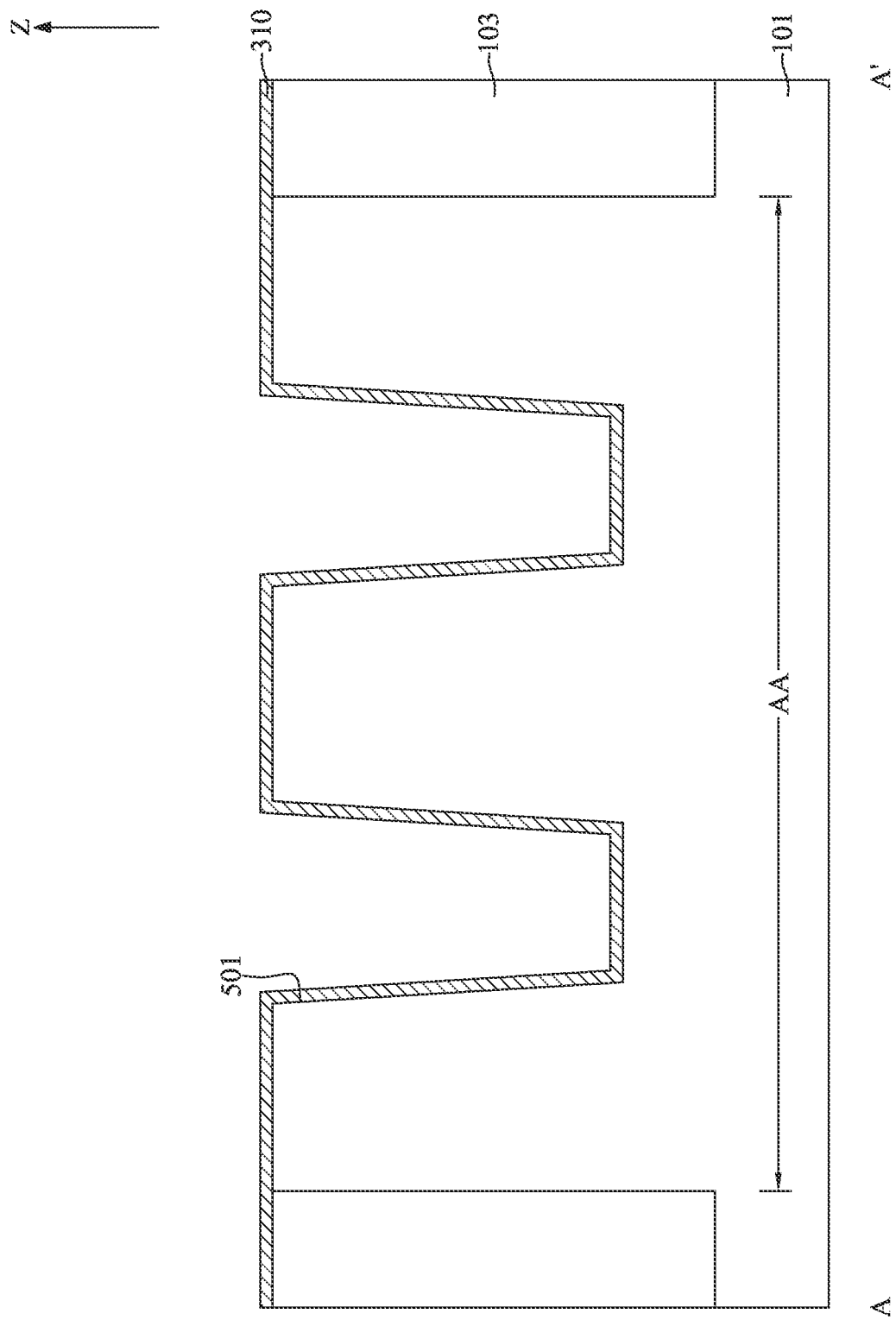
Figure 7:
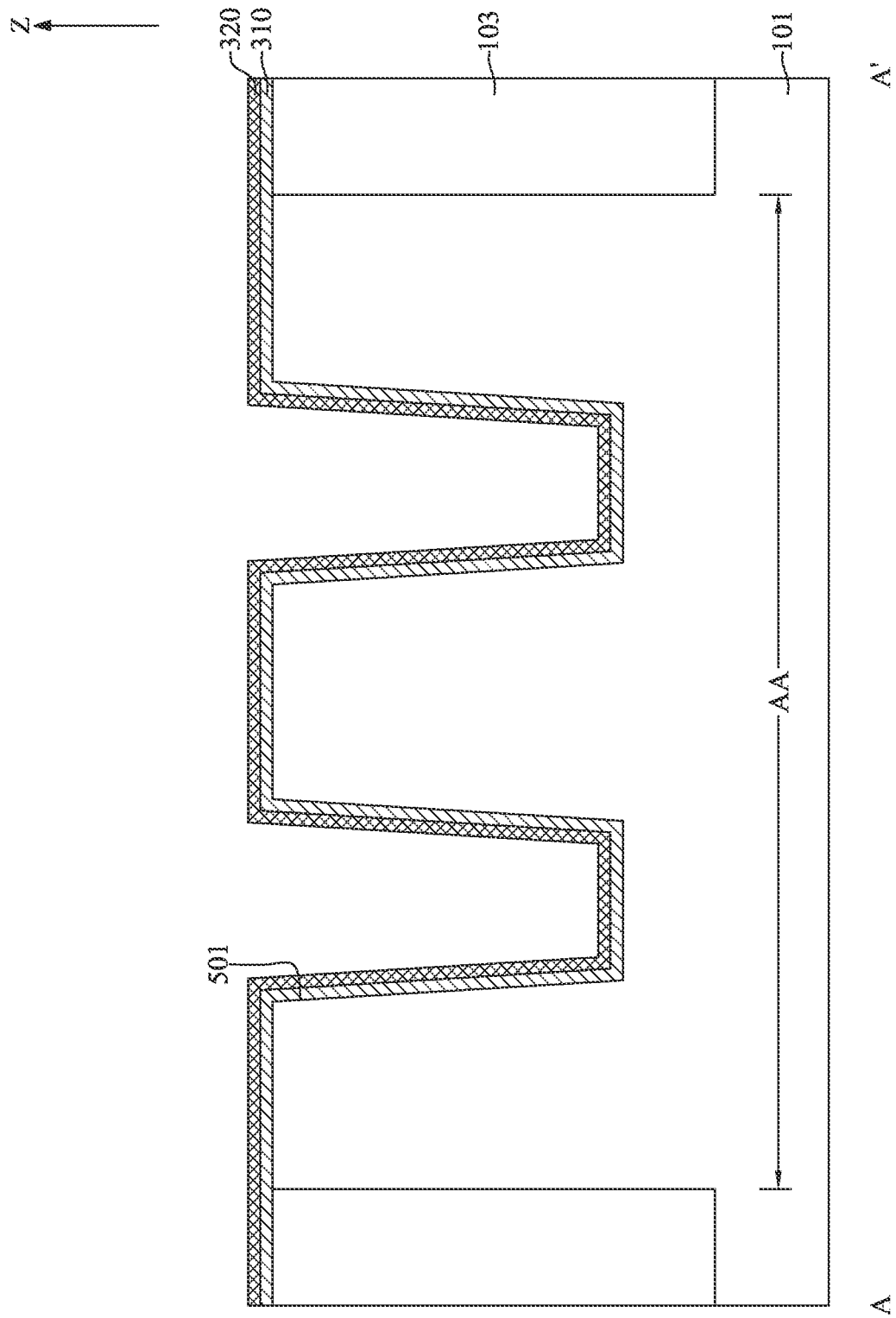

With reference to FIGS. 1, 6, and 7, at step S15, a first insulating layer 310 may be conformally formed in the plurality of word line trenches 501, and a first barrier layer 320 may be conformally formed on the first insulating layer 310.

With reference to FIG. 6, in some embodiments, the first insulating layer 310 may be formed by a thermal oxidation process. For example, the first insulating layer 310 may be formed by oxidizing the surface of the word line trenches 501. In some embodiments, the first insulating layer 310 may be formed by a deposition process such as a chemical vapor deposition or an atomic layer deposition. The first insulating layer 310 may include a high-k material, an oxide, a nitride, an oxynitride or combinations thereof. In some embodiments, after a liner polysilicon layer is deposited, the first insulating layer 310 may be formed by radical-oxidizing the liner polysilicon layer. In some embodiments, after a liner silicon nitride layer is formed, the first insulating layer 310 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIG. 7, the first barrier layer 320 may be conformally formed on the first insulating layer 310 and in the word line trenches 501. In some embodiments, the first barrier layer 320 may be formed by, for example, atomic layer deposition. The first barrier layer 320 may prevent metal ion in the first conductive layer 330, which will be illustrated later, diffusing into the substrate 101 and may improve the adhesion between the first insulating layer 310 and the first conductive layer 330. In some embodiments, the first barrier layer 320 may be formed of, for example, titanium nitride. The first barrier layer 320 may include a columnar grain structure.

Figure 9:
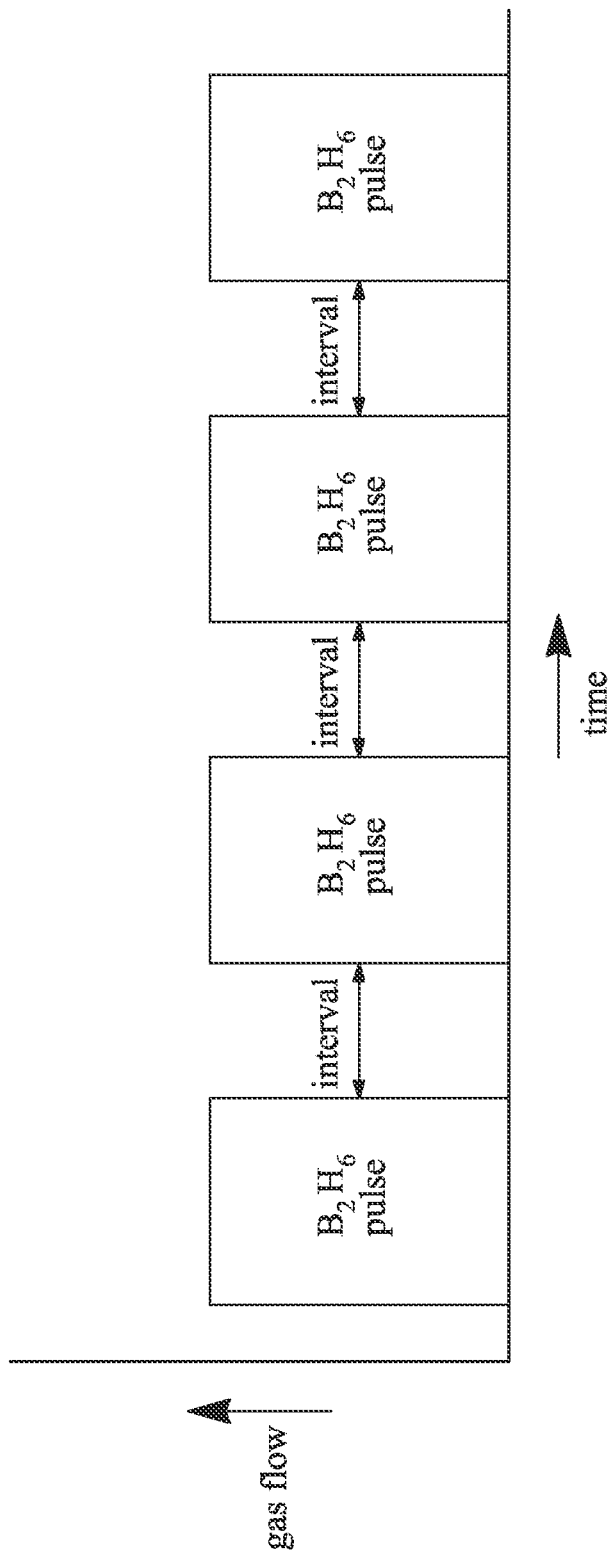
FIG. 9 is a graph representing reducing agent pulses and interval times of a post-treatment in accordance with one embodiment of the present disclosure.
Figure 10:
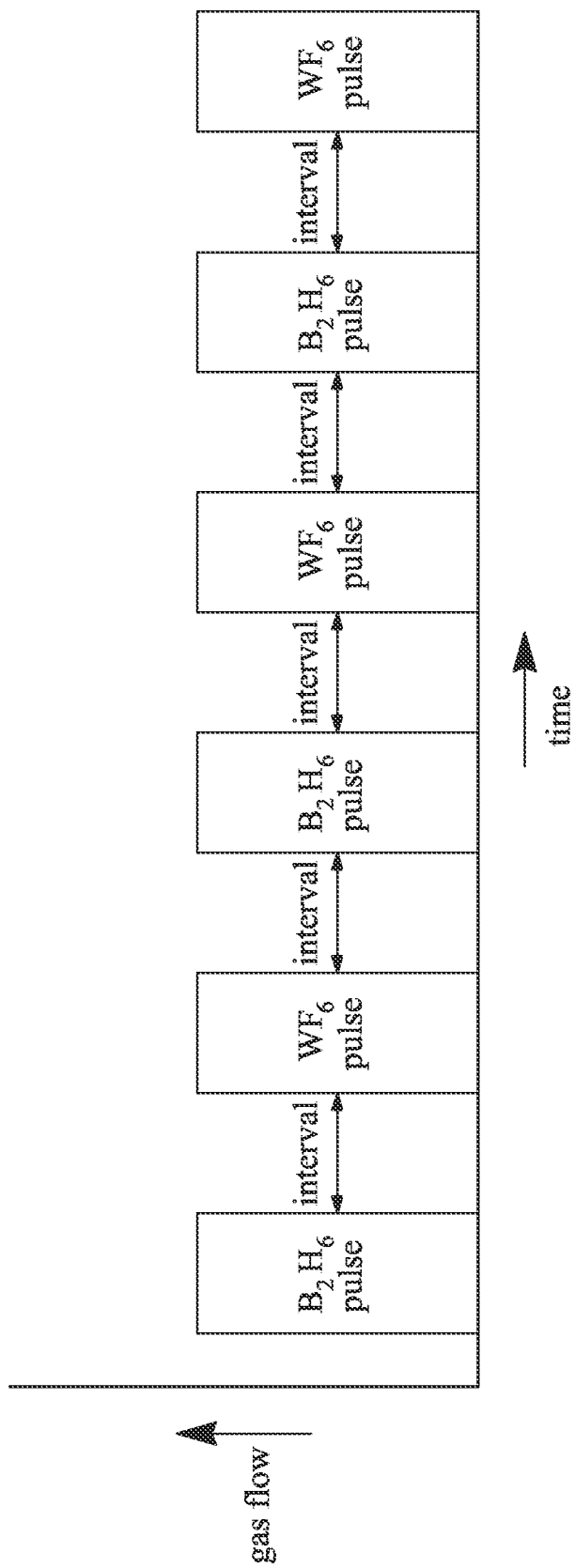
FIG. 10 is a graph representing reducing agent pulses and interval times of a post-treatment in accordance with another embodiment of the present disclosure.
Figure 11:
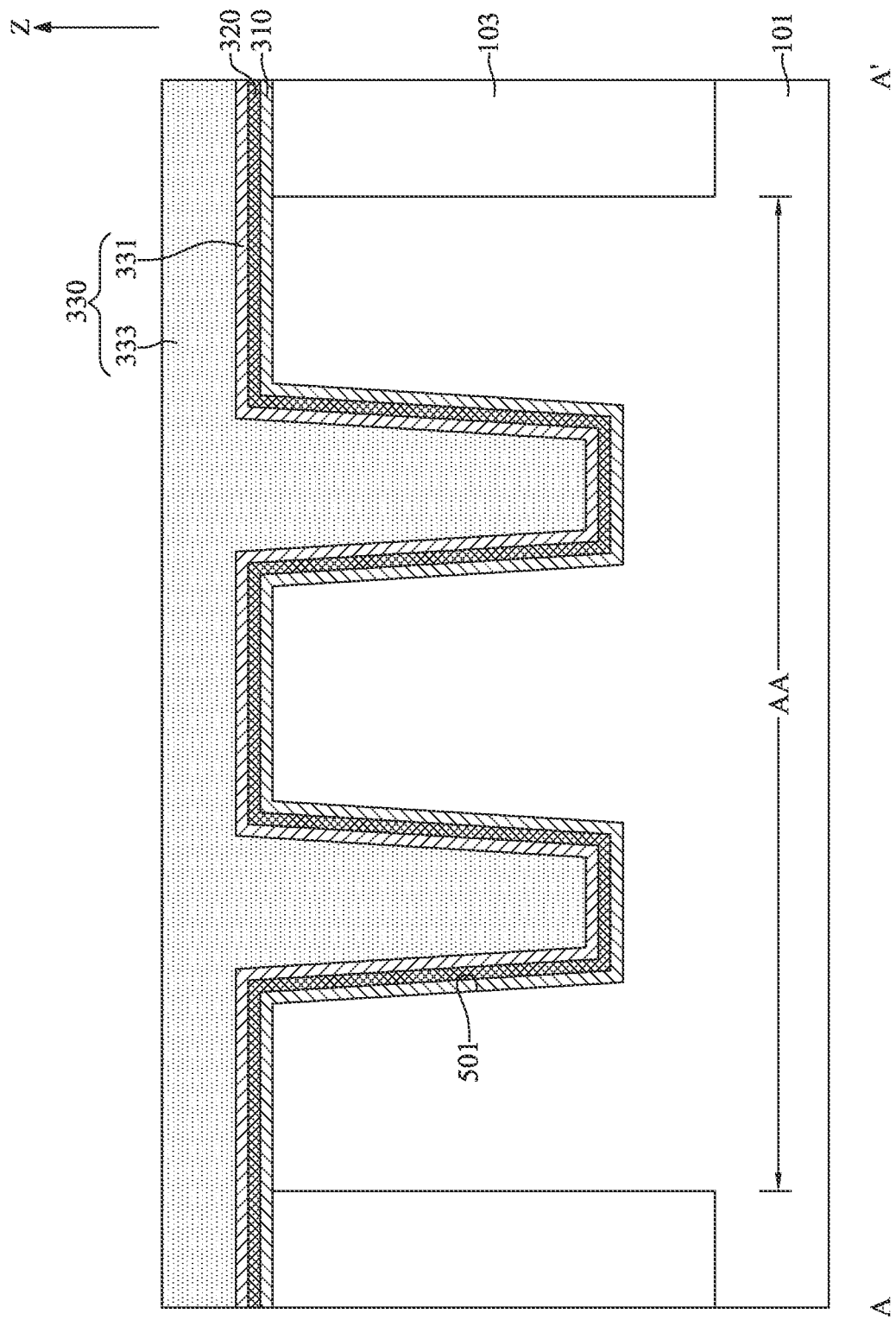
FIGS. 11 and 12 are schematic cross-sectional view diagrams taken along a line A-A' in FIG. 4 illustrating part of the flow for fabricating the semiconductor device in accordance with one embodiment of the present disclosure.
Figure 12:
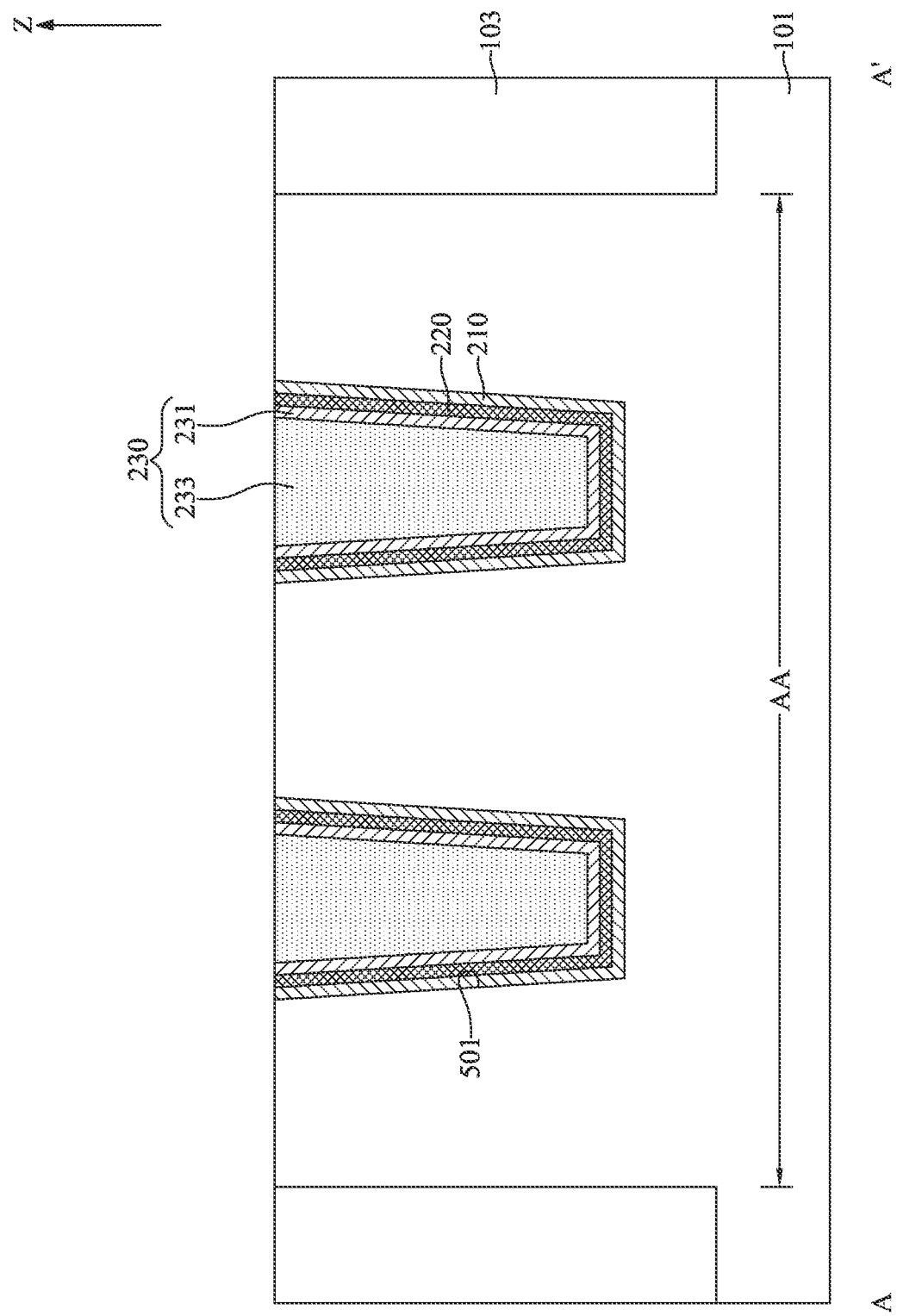

FIG. 9 is a graph representing reducing agent pulses and interval times of a post-treatment in accordance with one embodiment of the present disclosure. FIG. 10 is a graph representing reducing agent pulses and interval times of a post-treatment in accordance with another embodiment of the present disclosure. The vertical axis represents gas flow rate, and the horizontal axis represents time. FIGS. 11 and 12 are schematic cross-sectional view diagrams taken along a line A-A' in FIG. 4 illustrating part of the flow for fabricating the semiconductor device 1A in accordance with one embodiment of the present disclosure.

With reference to FIG. 1 and FIGS. 8 to 11, at step S17, a first nucleation layer 331 may be conformally formed on the first barrier layer 320, a post-treatment may be performed to the first nucleation layer 331, and a first bulk layer 333 may be formed on the first nucleation layer 331, wherein the first nucleation layer 331 and the first bulk layer 333 together configure a first conductive layer 330.

Figure 8:
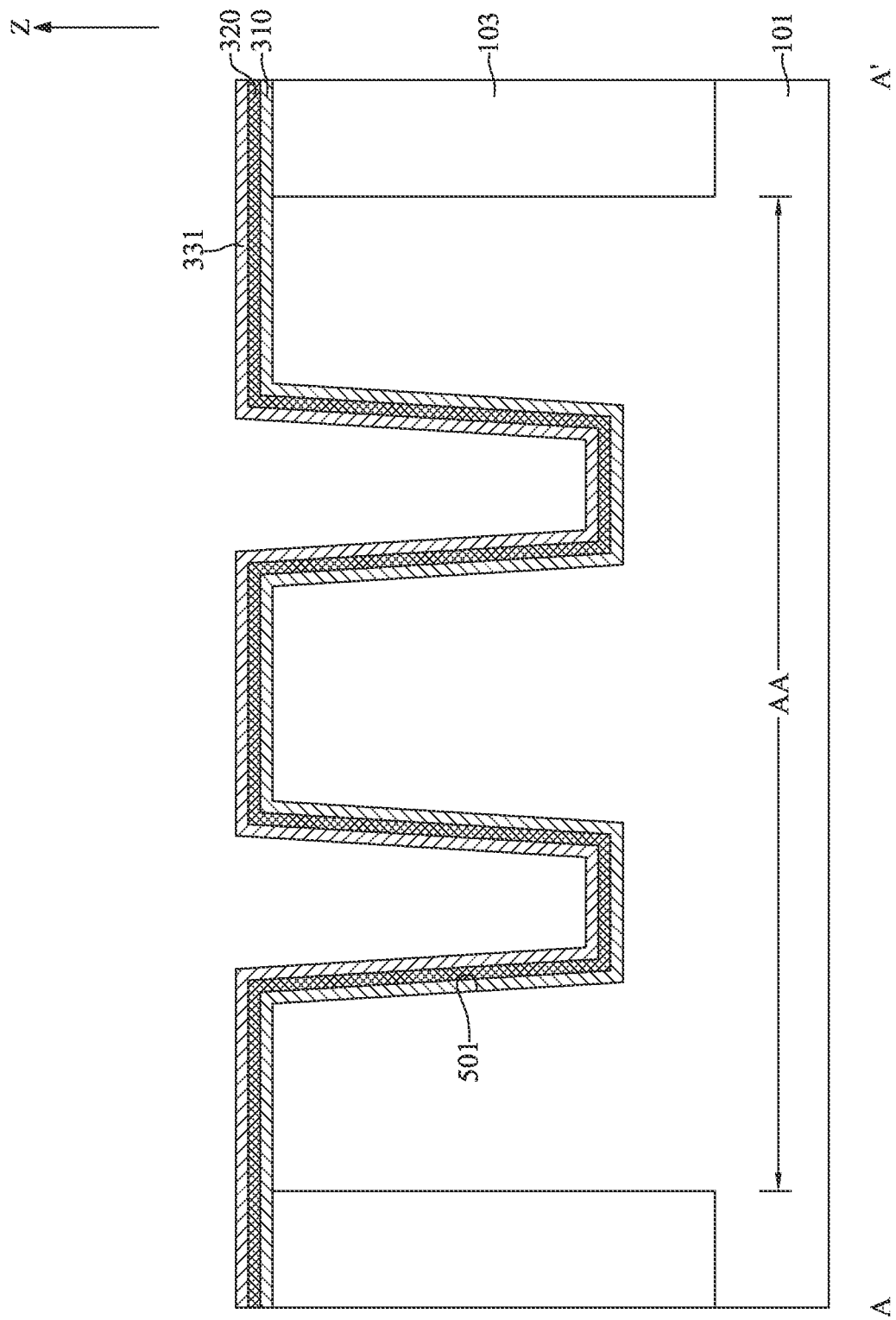

With reference to FIG. 8, the first nucleation layer 331 and the first bulk layer 333 may include tungsten. Tungsten may be particularly useful in gate electrodes and word and bit lines in dynamic random access memory types of integrated circuit devices because of its thermal stability during subsequent high temperature processes, where processing temperatures may reach 900° C. or more. Additionally, tungsten is a highly refractive material which offers good oxidation resistance and also lower resistivity.

In some embodiments, the first nucleation layer 331 may be a thin conformal layer that serves to facilitate the subsequent formation of a bulk material (i.e., the first bulk layer 333) thereon. Conforming to the underlying first barrier layer 320 may be critical to support high quality deposition. In some embodiments, the first nucleation layer 331 may be formed by a pulsed nucleation layer method.

In the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate (e.g., the first barrier layer 320), available to react with the next reactant. The process is repeated in a cyclical fashion until the desired thickness is achieved. It should be noted that, the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

In some embodiments, the reactants of forming the first nucleation layer 331 may be, for example, a silicon-containing reducing agent and a tungsten-containing precursor. The first barrier layer 320 may be initially exposed to the silicon-containing reducing agent and followed by exposing to the tungsten-containing precursor to form the first nucleation layer 331. The exposure to the silicon-containing reducing agent and the tungsten-containing precursor may be defined as a cycle and may be repeated until the desired thickness of the first nucleation layer 331 is achieved.

Silane and related compounds have been found to adsorb well to metal nitride surfaces such as titanium nitride and tungsten nitride used as barrier layer materials in some integrated circuit applications. Any suitable silane or silane derivative may be used as the silicon-containing reducing agent, including organic derivative of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the silicon-containing reducing agent may be between about 200° C. and about 475° C., between about 300° C. and about 400° C., or about 300° C. In some embodiments, the chamber pressure during exposure to the silicon-containing reducing agent may be between about 1 Torr and about 350 Torr or be fixed around 40 Torr. The exposure time (or pulse time) may be vary depending in part upon dosages and chamber conditions. In some embodiments, the first barrier layer 320 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

In some embodiments, once the first barrier layer 320 is sufficiently covered with silane species, the flow of the silicon-containing reducing agent may be stopped. A purge process may be performed to clear residual gas reactants near the surface of the first barrier layer 320. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying with gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the first nucleation layer 331. Thereafter, the flow of tungsten-containing precursor may be stopped, and a purge process may be performed with a carrier gas such as argon, hydrogen, nitrogen, or helium.

Alternatively, in some embodiments, the reactants of forming the first nucleation layer 331 may be, for example, a boron-containing reducing agent and the tungsten-containing precursor. The first barrier layer 320 may be initially exposed to the boron-containing reducing agent and followed by exposing to the tungsten-containing precursor to form the first nucleation layer 331. The exposure to the boron-containing reducing agent and the tungsten-containing precursor may be defined as a cycle and may be repeated until the desired thickness of the first nucleation layer 331 is achieved.

In some embodiments, the boron-containing reducing agent may be, for example, borane, diborane, triborane, or boron halides (e.g., $BF_3$, $BCl_3$) with hydrogen. The tungsten-containing precursor may be material similar to the tungsten-containing precursor mentioned above, and descriptions thereof are not repeated herein. In some embodiments, the boron-containing reducing agent may be provided in a dilution gas, accompanying with gases such as argon, nitrogen, hydrogen, silane, or a combination thereof. For example, diborane may be provided from a diluted source (e.g., 5% diborane and 95% nitrogen). In some embodiments, the substrate temperature during exposure to the boron-containing reducing agent may be between about 200° C. and about 475° C., between about 300° C. and about 400° C., or about 300° C. In some embodiments, the chamber pressure during exposure to the boron-containing reducing agent may be between about 1 Torr and about 350 Torr. In some embodiments, once the boron-containing reducing agent is deposited to a sufficient thickness, the flow of boron-containing reducing agent may be stopped. A purge process may be performed with a carrier gas such as argon, hydrogen, nitrogen or, helium.

After exposure to the boron-containing reducing agent, the intermediate semiconductor device may be then exposed to the tungsten-containing precursor. The process is similar to that exposure to the tungsten-containing precursor after exposing to the silicon-containing reducing agent, and descriptions thereof are not repeated herein.

In some embodiments, a pre-treatment may be performed to the first barrier layer 320 before forming the first nucleation layer 331 using exposure to the boron-containing reducing agent and the tungsten-containing precursor. The pre-treatment may include diborane.

In some embodiments, exemplary data reviles that the diborane-based first nucleation layer 331 may produce tungsten with greater grain size in the initial stage of forming the first nucleation layer 331. In contrast, the silane-based first nucleation layer 331 may produce tungsten with smaller grain size in the initial stage of forming the first nucleation layer 331. That is, the deposited first bulk layer 333 form on the silane-based first nucleation layer 331 may have less or no defects such as seam and void.

Alternatively, the first nucleation layer 331 may be formed sequentially exposing to the silicon-containing reducing agent, the tungsten-containing precursor, the boron-containing reducing agent, and the tungsten-containing precursor. The four steps of exposure may be defined as a cycle. The entire four-step cycle may be repeated to form the first nucleation layer 331 with the desired thickness. In a variation of the process, the first two steps of the cycle (sequential exposure to the silicon-containing reducing agent and the tungsten-containing precursor) may be repeated one or more time prior to contact with the boron-containing reducing agent. In another variation, the last two steps of the cycle (sequential exposure to the boron-containing reducing agent and the tungsten-containing precursor) may be repeated one or more times after the first two steps are completed.

Alternatively, in some embodiments, the reactants of forming the first nucleation layer 331 may be, for example, a germanium-containing reducing agent and the tungsten-containing precursor. The first barrier layer 320 may be initially exposed to the germanium-containing reducing agent and followed by exposing to the tungsten-containing precursor to form the first nucleation layer 331. In some embodiments, the germanium-containing reducing agent may be a germane such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, for example, alkyl germanes, alkyl germanium, aminogermanes, carbogermanes, and halogermane. The tungsten-containing precursor may be material similar to the tungsten-containing precursor mentioned above, and descriptions thereof are not repeated herein.

An exemplary process for forming the first nucleation layer 331 may be illustrated as follow.

Firstly, the intermediate semiconductor device illustrated in FIG. 7 may be exposed to pulses of the germanium-containing reducing agent in a hydrogen environment to form a layer of germanium on the first bather layer 320. In some embodiments, the hydrogen-to-germanium-containing reducing agent ratio may be about 10:1, about 50:1, about 70:1, or about 100:1. The presence of hydrogen may decrease the thickness deposited per cycle, as well as decrease the resistivity of the deposited first bulk layer 333.

In some embodiments, pulses of one or more additional reducing agents, such as pulses of the boron-containing or silicon-containing reducing agent, may be used. The additional reducing agents may be pulsed sequentially or simultaneously with the germanium-containing reducing agent. In some embodiments, interval time pauses between pulses may be between about 0.5 seconds about 5 seconds. In some embodiments, the pulses of germanium-containing reducing agent may be optional, only the pulses of the boron-containing or silicon-containing reducing agent may be used.

In some embodiments, the duration of pulse (or pulse time) may be between about 0.25 seconds and about 30 seconds, between about 0.25 seconds and about 5 seconds, or between about 0.5 seconds and about 3 seconds. The pulse may be sufficient to saturate or oversaturate the surface of the first barrier layer 320. In some embodiments, a carrier gas may be used, such as argon, helium, or nitrogen. In some embodiments, an optional purge process may be performed to purge excess germanium-containing reducing agent still in gas phase that did not adsorb to the surface of the first barrier layer 320. The purge process may be conducted by flowing an inert gas at a fixed pressure thereby reducing the pressure of the chamber and re-pressurizing the chamber before initiating another gas exposure.

Next, the intermediate semiconductor device may be exposed to pulses of the tungsten-containing precursor. The tungsten-containing precursor reacts with the deposited layer of germanium to form elemental tungsten. In some embodiments, the duration of pulse (or pulse time) may be between about 0.25 seconds and about 30 seconds, between about 0.25 seconds to about 5 seconds, or between about 0.5 seconds to about 3 seconds. The pulse may be sufficient to react with the reactive sites on the surface of the first bather layer 320 where germanium adsorbed onto the surface. In some embodiments, the interval time pauses between pulses may be between about 0.5 seconds about 5 seconds.

In some embodiments, a carrier gas may be used, such as argon, helium, or nitrogen. In some embodiments, exposure to the tungsten-containing precursor may be performed in a hydrogen environment. In some embodiments, an optional purge process may be performed to purge excess tungsten-containing precursor still in gas phase that did not react to the germanium adsorbed onto the surface of the first barrier layer 320. The purge process may be conducted by flowing an inert gas at a fixed pressure thereby reducing the pressure of the chamber and re-pressurizing the chamber before initiating another gas exposure.

Finally, exposure to the pulses of the germanium-containing reducing agent and the tungsten-containing precursor may be repeated until a desired thickness of the first nucleation layer 331 is deposited on the surface of the first barrier layer 320. Each repetition of exposure to the pulses of the germanium-containing reducing agent and the tungsten-containing precursor may be referred to as a cycle.

In some embodiments, the order of exposure to the pulses of the germanium-containing reducing agent and the tungsten-containing precursor may be reversed, such that tungsten-containing precursor is pulsed first.

With reference to FIG. 9, in some embodiment, after the formation of the first nucleation layer 331, the post-treatment may be performed to the first nucleation layer 331. During the post-treatment, the first nucleation layer 331 may be exposed to one or more pulses of reducing agent(s) prior to forming the first bulk layer 333 on the first nucleation layer 331. Exposure to the reducing agent pulse(s) may improve the resistivity of the overall structure including the first nucleation layer 331 and the first bulk layer 333.

With reference to FIG. 9, the first nucleation layer 331 may be exposed to multiple reducing agent pulses with interval times between the pulses. During an interval time, no reducing agent flows to the first nucleation layer 331. In some embodiments, the reducing agent may be diborane, though other reducing agents may be used. In some embodiments, the flow rate of the reducing agent during a pulse is between about 100 standard cubic centimeters per minute (sccm) and 500 sccm. In some embodiments, the pulse time (or duration of pulse) of each reducing agent pulse may be between about 0.5 seconds and about 5 seconds, or between about 1 seconds and 2 seconds. In some embodiments, the number of reducing agent pulses may be between 2 and 8. In some embodiments, the process pressure of the post-treatment may be between about 2 Torr and about 100 Torr, or between about 20 Torr and about 40 Torr.

In some embodiments, the reducing agent may be provided in a dilution gas, accompanying with gases such as argon, nitrogen, hydrogen, silane, or a combination thereof. For example, diborane may be provided from a diluted source (e.g., 5% diborane and 95% nitrogen). In some embodiments, an inert gas/hydrogen gas mixture may continuously flow to the first nucleation layer 331 during both the reducing agent pulses and the interval times of the post-treatment. In some embodiments, the inert gas may be argon. In contrast, no other gases, other than a continuously flowing inert gas/hydrogen mixture or other background gas, flow to the post-treatment during the interval times of the post-treatment, i.e., there are no intervening pulse operations during the interval time between the reducing agent pulses.

In some embodiments, the intermediate semiconductor device illustrated in FIG. 8 may be pre-heated to between about 375° C. and about 415° C., or about 395° C. to stabilize before the post-treatment. In some embodiments, the intermediate semiconductor device after the post-treatment may be heated to between about 375° C. and about 415° C., or about 395° C. The preheat process before exposing the post-treatment and the thermal treatment after the post-treatment may enhance film adhesion and improve sheet resistance percent non-uniformity.

In some embodiments, the first nucleation layer 331 may be exposed to an additional tungsten-containing precursor after the post-treatment to form an additional portion of the first nucleation layer 331 before depositing the first bulk layer 333 on the first nucleation layer 331. Any suitable tungsten containing precursor may be used. For example, the tungsten-containing precursor may include tungsten hexafluoride, tungsten hexachloride, or tungsten hexacarbonyl. The tungsten-containing precursor may be provided in a dilution gas accompanying with gases such as argon, nitrogen, hydrogen, or a combination thereof.

With reference to FIG. 10, alternatively, in some embodiments, the first nucleation layer 331 may be alternatively exposed to multiple pulses of reducing agents with interval times between the pulses. During an interval, no reducing agent flows to the first nucleation layer 331. In some embodiments, the reducing agents such as diborane and a tungsten-containing precursor may alternatively flow (or introduce) to the first nucleation layer 331.

In some embodiments, the flow rate of the diborane may be between about 100 sccm and about 500 sccm, or about 300 sccm. In some embodiments, the tungsten-containing precursor may include, for example, tungsten hexafluoride, tungsten hexachloride, or tungsten hexacarbonyl. The flow rate of the tungsten-containing precursor may be between about 100 sccm and about 500 sccm, or about 100 sccm. In some embodiments, the pulse time (or duration of pulse) may be between about 0.5 seconds and 5 seconds, or between about 1 seconds and 2 seconds. In some embodiments, the interval time between each pulse may be between about 2 seconds and about 5 seconds. In some embodiments, the number of pulses may be between 2 and 8. In some embodiments, the chamber pressure may be between about 2 Torr and about 100 Torr, or between about 20 Torr and about 40 Torr.

In some embodiments, the pulse time should be short enough to ensure that no or substantially no tungsten deposits. In some embodiments, the amount of the tungsten-containing precursor applied to the first nucleation layer 331 during the post-treatment may be less than the amount of tungsten-containing precursor applied to the first bather layer 320 during forming the first nucleation layer 331. In some embodiments, the pulse time of the tungsten-containing precursor applied to the first nucleation layer 331 during the post-treatment may be less than the pulse time of tungsten-containing precursor applied to the first bather layer 320 during forming the first nucleation layer 331.

In certain embodiments, the reducing agent and tungsten-containing precursor pulses may be as short as less than 1 second. In one example, diborane ($B_2H_6$) may be pulsed for 1 second, followed by a 1 second purge, followed by a tungsten hexafluoride ($WF_6$) pulse of 1 second, followed by a 2.5 second purge. This cycle is then repeated four times.

No bound by a particular theory, it is believed that the introduction of the tungsten hexafluoride pulses between diborane pulses may help scavenge unreacted diborane, which otherwise promotes the onset of micropeeling, from the surface of the first nucleation layer 331.

In some embodiments, the post-treatment may be performed between about 10 seconds and about 50 seconds, or between about 10 seconds and about 30 seconds. Longer post-treatment time (or duration) may induce decomposition of diborane which has an adverse effect on the resistivity of the deposited first bulk layer 333.

With reference to FIG. 11, the first bulk layer 333 may be formed on the first nucleation layer 331 and completely fill the word line trenches 501. The first bulk layer 333 and the first nucleation layer 331 together configure a first conductive layer 330. The first bulk layer 333 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof.

For example, the deposition of the first bulk layer 333 using chemical vapor deposition may include flowing (or introducing) a tungsten-containing precursor and a co-reactant such as a reducing agent to the intermediate semiconductor device including the first nucleation layer 331. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

In some embodiments, the grain size of tungsten of the first bulk layer 333 may be greater than 30 nm, than 50 nm, than 70 nm, than 80 nm, than 85 nm, or than 87 nm. In some embodiments, the first bulk layer 333 may include alpha phase tungsten.

By employing the post-treatment to the first nucleation layer 331, the deposited first conductive layer 330 may have tungsten with greater grain size and improved resistivity.

It should be noted that the aforementioned procedures of forming the first conductive layer 330 in the word line trenches 501 and performing the post-treatment to the first nucleation layer 331 are just for illustration purpose. The object to be formed and treated (e.g., the substrate 101 with the word line trenches 501) are not limited. For example, the object to be formed and treated may be a bulk semiconductor layer, a bulk dielectric layer, a barrier layer, or a thin insulating film. The object to be formed and treated may include or may not include a recess. The recess may be referred to a structure that has a re-entrant profile. The re-entrant profile may have a narrow bottom (also named as closed end or interior) towards a wide opening. The recess may be used interchangeably with trench, groove, opening, via hole, or any applicable term that indicates a space inwardly formed in the object to be formed. The first conductive layer 330 may be further processed to form, for example, a gate electrode, a word line, a bit line, a contact, a metal line, a via, or other applicable conductive elements in the semiconductor device.

In some embodiments, an under-layer may be conformally formed in the recess prior to forming the first conductive layer 330. The under-layer may be a barrier layer or an adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the under-layer may be titanium nitride, titanium metal, tungsten nitride, titanium aluminide, titanium oxide, or a combination thereof.

Figure 13:
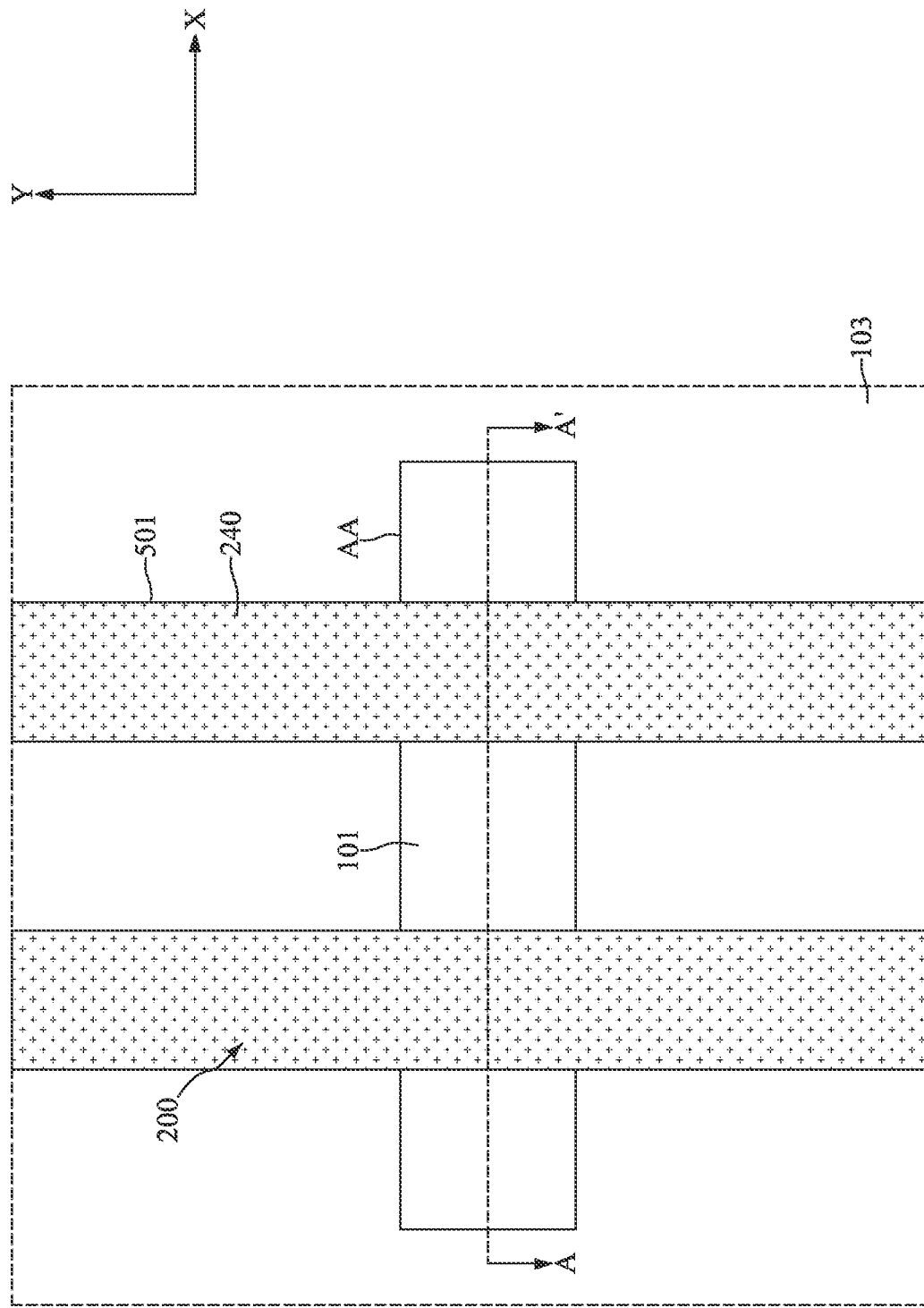
FIG. 13 illustrates, in a schematic top-view diagram, part of the flow for fabricating the semiconductor device in accordance with one embodiment of the present disclosure.
Figure 14:
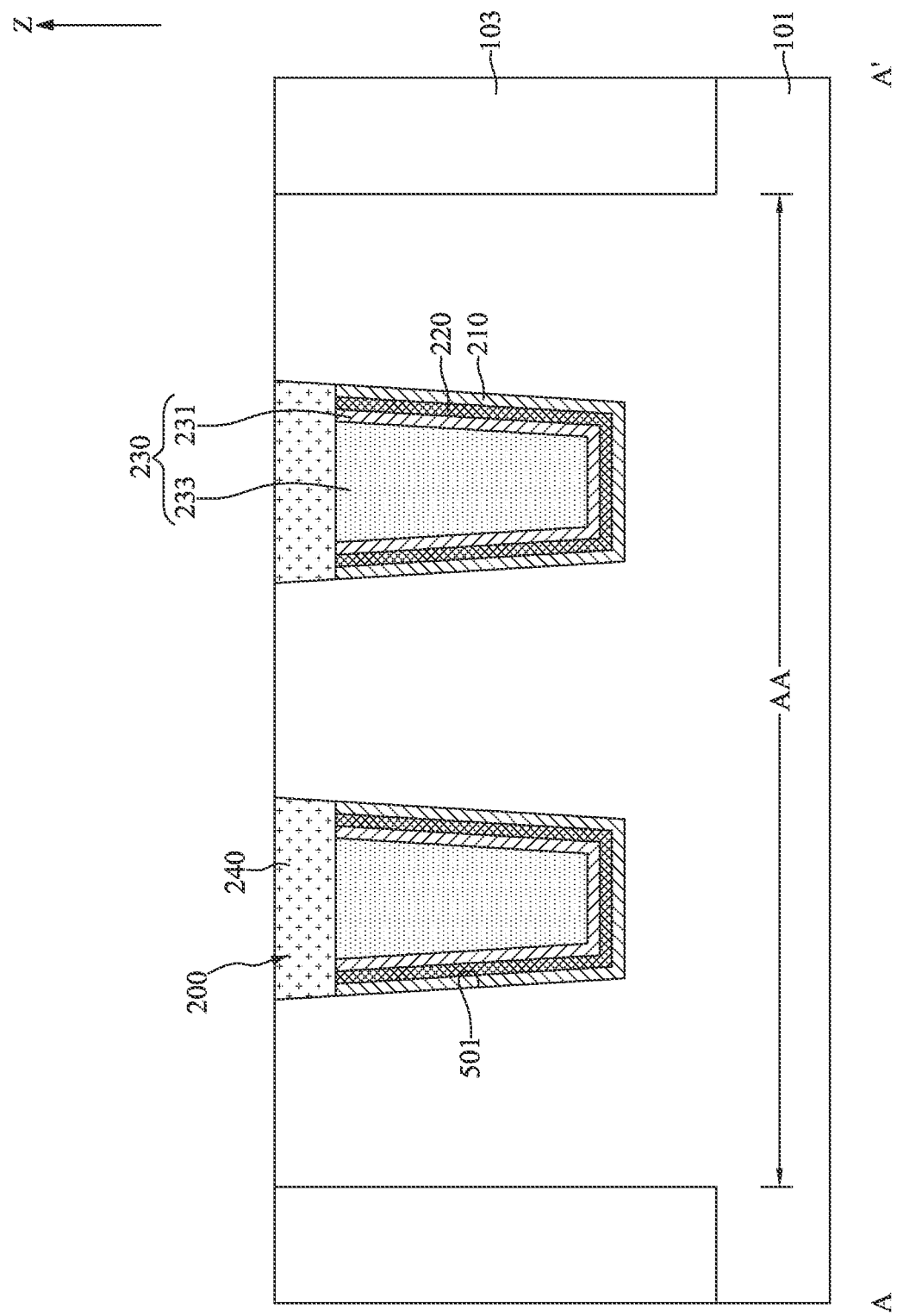
FIG. 14 is a schematic cross-sectional view diagram taken along a line A-A' in FIG. 13 illustrating part of the flow for fabricating the semiconductor device in accordance with one embodiment of the present disclosure.

FIG. 13 illustrates, in a schematic top-view diagram, part of the flow for fabricating the semiconductor device 1A in accordance with one embodiment of the present disclosure. FIG. 14 is a schematic cross-sectional view diagram taken along a line A-A' in FIG. 13 illustrating part of the flow for fabricating the semiconductor device 1A in accordance with one embodiment of the present disclosure.

With reference to FIG. 1 and FIGS. 12 to 14, at step S19, a plurality of word line structures 200 may be formed in the plurality of word line trenches 501 by planarizing the first insulating layer 310, the first barrier layer 320, and the first conductive layer.

With reference to FIG. 12, a planarization process, such as chemical mechanical polishing, may be performed until the top surface of the substrate 101 and the top surface of the isolation layer 103 are exposed. After the planarization process, the first insulating layer 310 may be turned into word line insulating layers 210 in the word line trenches 501, the first barrier layer 320 may be turned into word line barrier layers 220 in the word line trenches 501, the first conductive layer 330 may be turned into word line conductive layers 230 in the word line trenches 501. Each of the word line conductive layers 230 includes a nucleation portion 231 and a bulk portion 233. The nucleation portion 231 is originated from the first nucleation layer 331 and the bulk portion 233 is originated from the first bulk layer 333.

For brevity, clarity, and convenience of description, only one word line insulating layer 210, one word line barrier layer 220, and one word line conductive layer 230 are described.

With reference to FIGS. 13 and 14, an etch process, such as an anisotropic dry etch process, may be performed to recess the word line insulating layer 210, the word line barrier layer 220, and the word line conductive layer 230. An insulating material may be filled into the recess. Subsequently, a planarization process, such as chemical mechanical polishing, may be performed until the top surface of the substrate 101 and the top surface of the isolation layer 103 are exposed to remove excess material, provide a substantially flat surface for subsequent processing steps, and concurrently form a word line capping layer 240. The insulating material may include, for example, silicon oxide, silicon nitride, silicon oxynitride, or silicon nitride oxide. The word line insulating layer 210, the word line barrier layer 220, the word line conductive layer 230, and the word line capping layer 240 together configure the word line structure 200.

Figure 15:
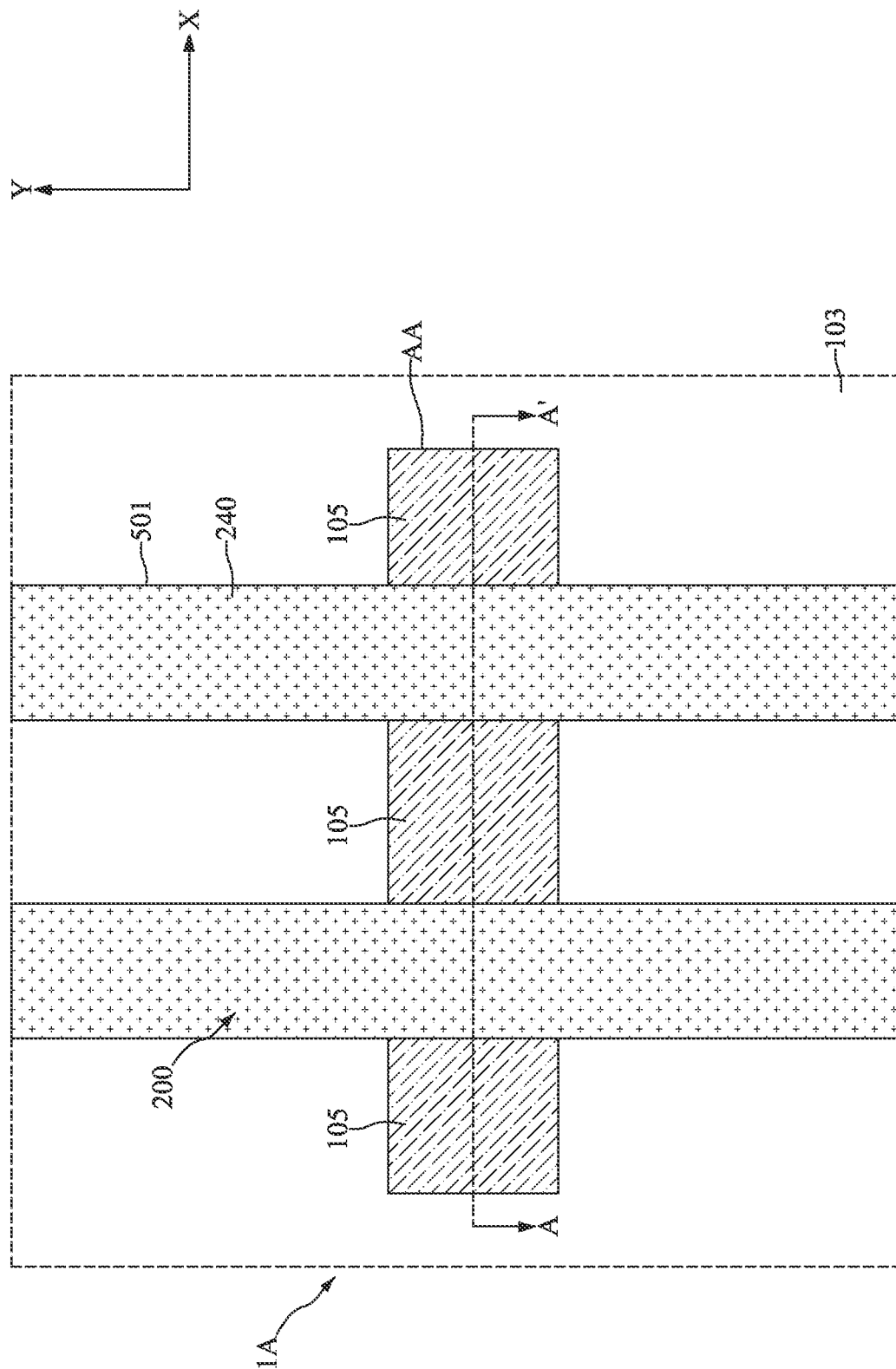
FIG. 15 illustrates, in a schematic top-view diagram, part of the flow for fabricating the semiconductor device in accordance with one embodiment of the present disclosure.
Figure 16:
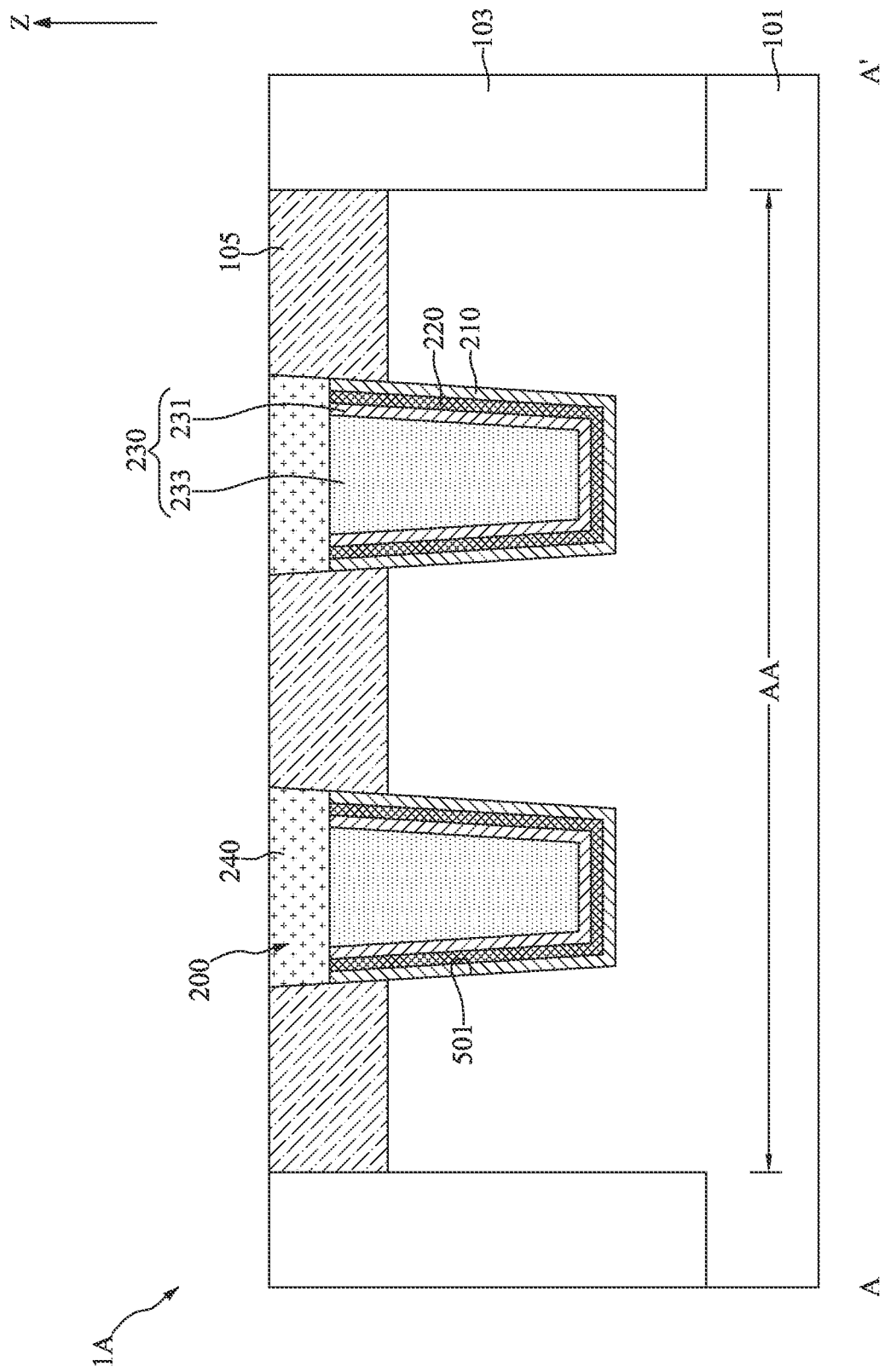
FIG. 16 is a schematic cross-sectional view diagram taken along a line A-A' in FIG. 15 illustrating part of the flow for fabricating the semiconductor device in accordance with one embodiment of the present disclosure.

FIG. 15 illustrates, in a schematic top-view diagram, part of the flow for fabricating the semiconductor device 1A in accordance with one embodiment of the present disclosure. FIG. 16 is a schematic cross-sectional view diagram taken along a line A-A' in FIG. 15 illustrating part of the flow for fabricating the semiconductor device 1A in accordance with one embodiment of the present disclosure.

With reference to FIGS. 1, 15, and 16, at step S21, a plurality of impurity regions 105 may be formed in the active area AA.

With reference to FIGS. 15 and 16, an n-type impurity implant process may be performed using the word line structures 200 as the masks to form the plurality of impurity regions 105 in the active area AA. The n-type impurity implant process may add impurities that contribute free electrons to an intrinsic semiconductor. In a silicon-containing substrate, examples of n-type dopants, i.e., impurities, include but are not limited to antimony, arsenic, or phosphorous. In some embodiments, the dopant concentration of the plurality of impurity regions 105 may be about 1E19 atoms/cm^3 to about 1E21/cm^3. The plurality of impurity regions 105 may be formed between the word line structures 200 and between the word line structure 200 and the isolation layer 103, respectively and correspondingly. The plurality of impurity regions 105 may be electrically coupled to bit lines and capacitors.

Figure 17:
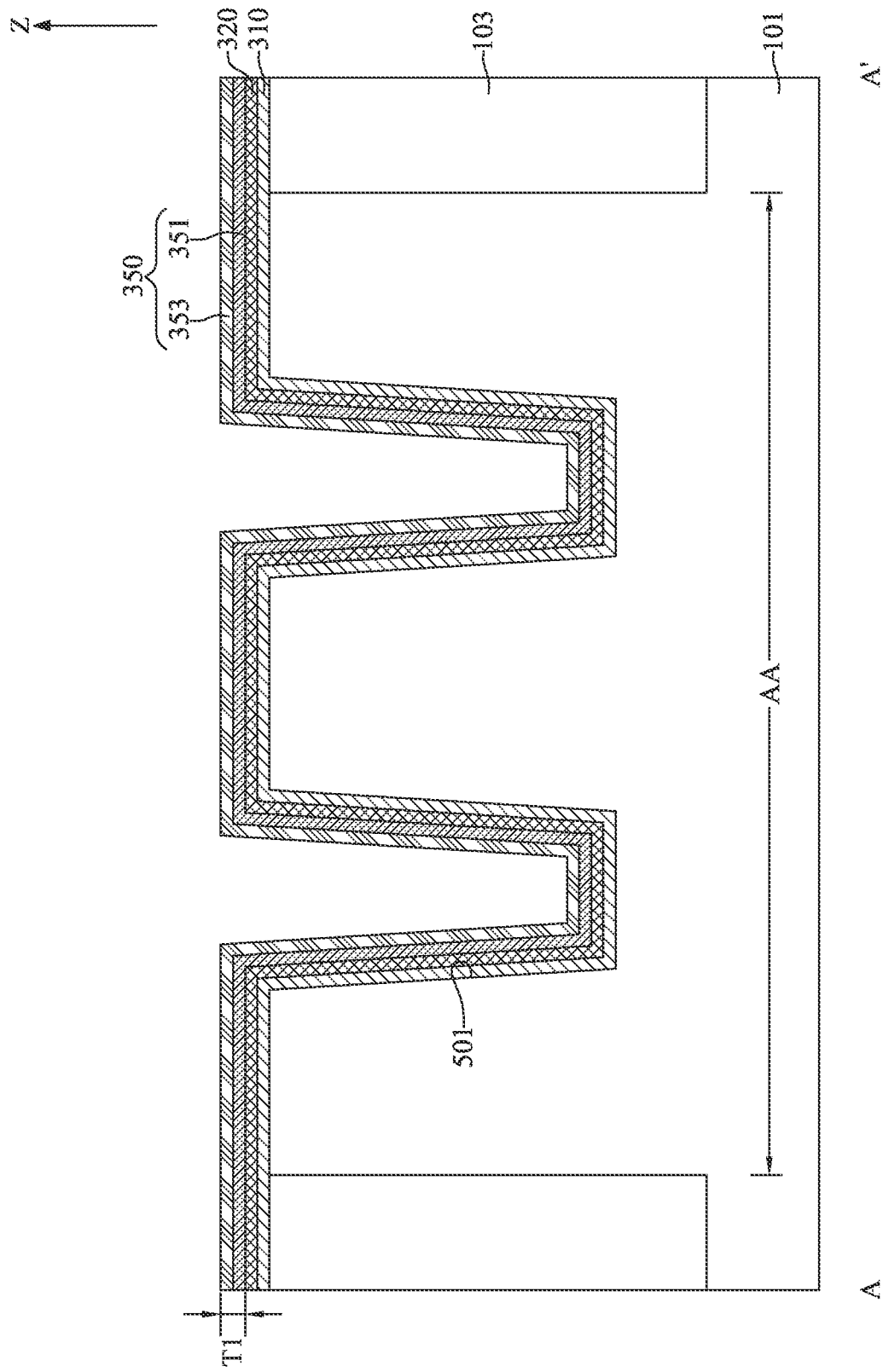
FIGS. 17 to 19 illustrate, in schematic cross-sectional view diagrams, a flow for fabricating a semiconductor device in accordance with another embodiment of the present disclosure.
Figure 18:
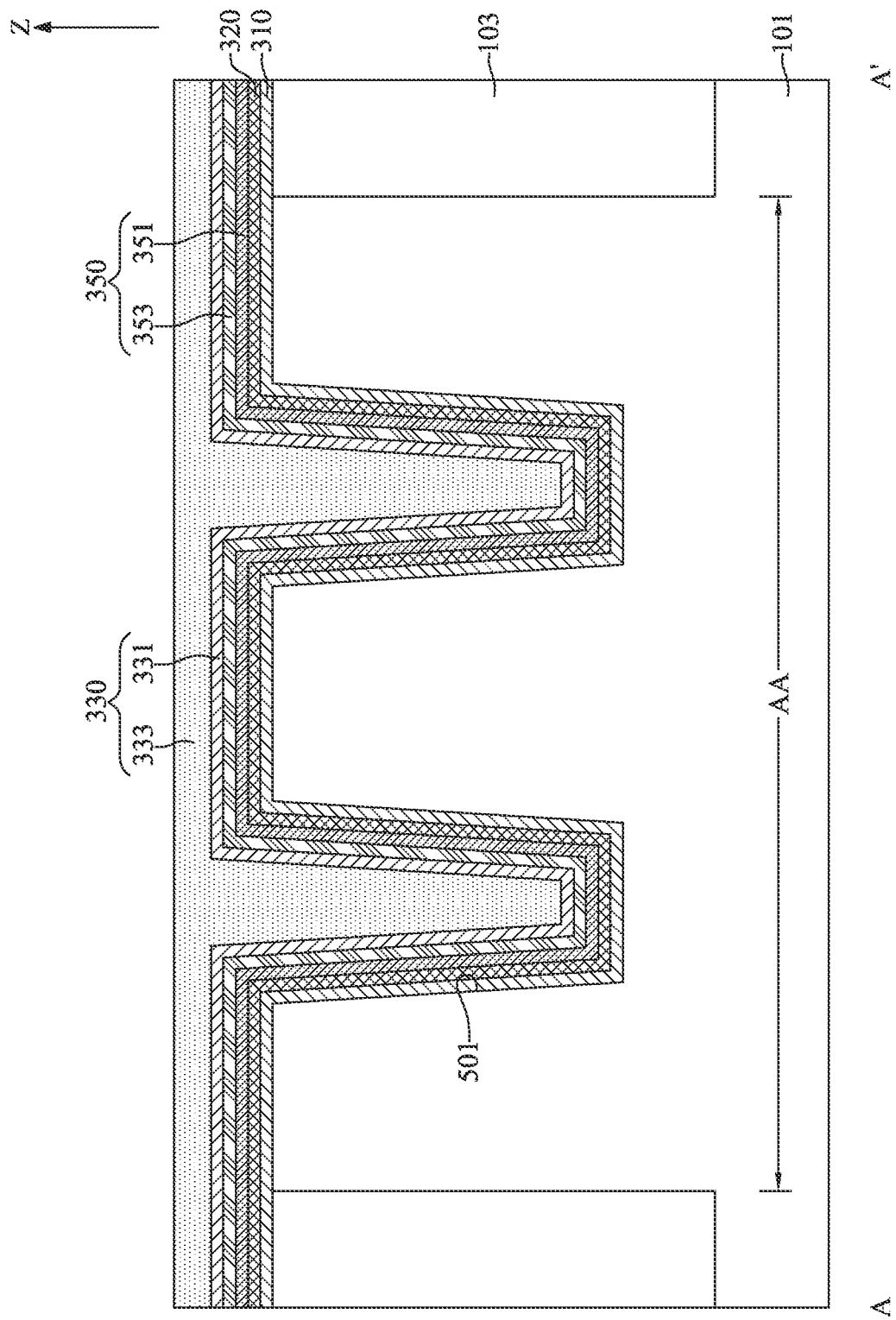
Figure 19:
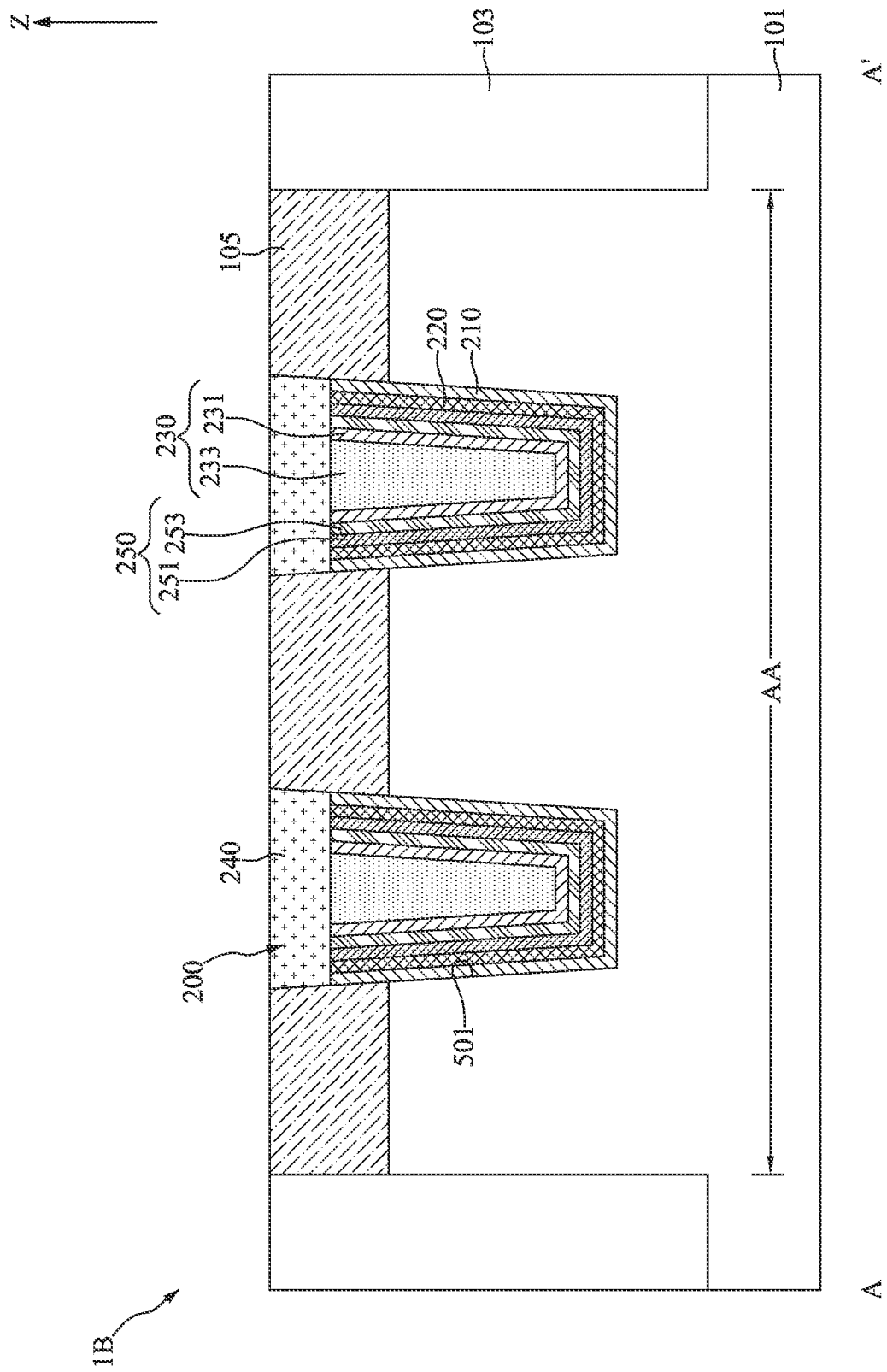

FIGS. 17 to 19 illustrate, in schematic cross-sectional view diagrams, a flow for fabricating a semiconductor device 1B in accordance with another embodiment of the present disclosure.

In certain embodiments, the first barrier layer 320 may be titanium nitride having a columnar grain structure. The columnar grain structure of titanium nitride may adversely affect the grain formation during forming the first conductive layer 330. Generally, the grain size of tungsten of the first conductive layer 330 affected by the columnar grain structure of titanium nitride may be less than 30 nm. As a result, the resistivity of the first conductive layer 330 affected by the columnar grain structure of titanium nitride may be worse.

With reference to FIG. 17, an intermediate semiconductor device may be fabricated with a procedure similar to that illustrated in FIGS. 2 to 7. A second conductive layer 350 may be formed on the first barrier layer 320 using the pulsed nucleation layer method. The second conductive layer 350 may include amorphous tungsten silicide. The thickness T1 of the second conductive layer 350 may be greater than about 4.1 nm. In some embodiments, the thickness T1 of the second conductive layer 350 may be greater than about 4.3 nm, than about 4.6 nm, or than about 5.2 nm. In some embodiments, the thickness T1 the second conductive layer 350 may be between about 4.3 nm and about 4.6 nm.

With reference to FIG. 17, in some embodiments, the second conductive layer 350 may include a second nucleation layer 351 and a second bulk layer 353. The second nucleation layer 351 may be conformally formed on the first barrier layer 320. Subsequently, the second bulk layer 353 may be conformally formed on the second nucleation layer 351.

In some embodiments, the second nucleation layer 351 and the second bulk layer 353 may be formed of tungsten silicide. Detailedly, the reactant gas (e.g., tungsten hexafluoride), the inert carrier gases (e.g., argon, nitrogen, and helium), and the desired silicon source gas may be combined in a premix chamber and then flow over the intermediate semiconductor device including the first barrier layer 320. The silicon source gas may be silane initially. The gas mixture may be used to form the second nucleation layer 351. Following formation of the second nucleation layer 351, the silicon source gas may be switched and dichlorosilane may be used as the silicon source gas for deposition of the second bulk layer 353. The switching of the silicon source gas may be performed abruptly or gradually.

In some embodiments, the flow rate of the inert carrier gases may be as great as five to ten times the flow rate of the silicon source gas (either silane or dichlorosilane). In some embodiments, the flow rate of the silicon source gas (either silane or dichlorosilane) in turn may be about 50 to 100 times the flow rate of the reactant gas. In some embodiments, the silane flow rate may be about 400 standard cubic centimeters per minute (sccm). The flow rate of reactant gas may be about 4 sccm. The flow rate of the inert carrier gases may be about 2800 sccm.

In some embodiments, the process temperature of forming the second nucleation layer 351 may be less than 500° C. In some embodiments, the process temperature of forming the second nucleation layer 351 may be about 450° C. In some embodiments, the process temperature of forming the second nucleation layer 351 may be about 400° C. or less than 400° C. In some embodiments, the process temperature of forming the second nucleation layer 351 may be between about 250° C. and about 400° C. In some embodiments, the second bulk layer 353 may be formed at a temperature the same as the process temperature of forming the second nucleation layer 351. In some embodiments, the process duration of forming the second nucleation layer 351 may be between about 1 seconds and about 25 seconds. In some embodiments, the substrate temperature of forming the second nucleation layer 351 may be between about 200° C. and about 500° C.

Due to the presence of the second nucleation layer 351, the second bulk layer 353 may be deposited using a process without any assistance of plasma enhance technique. As a result, the equipment requirement for forming the second conductive layer 350 may be easier and the cost of forming the second conductive layer 350 may be reduced.

With reference to FIG. 18, the first nucleation layer 331 may be conformally formed on the second bulk layer 353 and the first bulk layer 333 may be formed on the first nucleation layer 331 with procedures similar to that illustrated in FIGS. 8 to 11, and descriptions thereof are not repeated herein.

Due to the presence of the second conductive layer 350 including amorphous tungsten silicide, the adverse effect originated from the columnar grain structure of titanium nitride may be reduced or avoided. As a result, the resistivity of the first conductive layer 330 may be improved.

With reference to FIG. 19, the word line capping layer 240 may be formed with a procedure similar to that illustrated in FIGS. 13 and 14, and descriptions thereof are not repeated herein. The second conductive layer 350 may be turned into word line intervening layers 250 in the word line trenches 501 by the planarization process. Each of the word line intervening layers 250 may include a nucleation portion 251 nucleation portion 251 and a bulk portion 253. The nucleation portion 251 may be originated form the second nucleation layer 351. The bulk portion 253 may be originated from the second bulk layer 353.

One aspect of the present disclosure provides a method for fabricating a conductive feature of a semiconductor device including providing a substrate; forming a recess in the substrate; conformally forming a first nucleation layer in the recess; performing a post-treatment to the first nucleation layer; and forming a first bulk layer on the first nucleation layer to fill the recess. The first nucleation layer and the first bulk layer configure the conductive feature. The first nucleation layer and the first bulk layer include tungsten. The post-treatment includes a borane-containing reducing agent.

Another aspect of the present disclosure provides a method for fabricating a semiconductor device including providing a substrate; forming a word line trench in the substrate; conformally forming a first insulating layer in the word line trench and conformally forming a first barrier layer on the first insulating layer; conformally forming a first nucleation layer on the first barrier layer; performing a post-treatment to the first nucleation layer, wherein the post-treatment includes a reducing agent including diborane; forming a first bulk layer on the first nucleation layer, wherein the first nucleation layer and the first bulk layer configure a first conductive layer; and performing a planarization process to turn the first insulating layer, the first barrier layer, and the first conductive layer into a word line insulating layer, a word line barrier layer, and a word line conductive layer, respectively and correspondingly, wherein the word line insulating layer, the word line barrier layer, and the word line conductive layer configure a word line structure. The first nucleation layer and the first bulk layer include tungsten.

Another aspect of the present disclosure provides a method for fabricating a semiconductor device including providing a substrate; forming a word line trench in the substrate; conformally forming a first insulating layer in the word line trench and conformally forming a first barrier layer on the first insulating layer; conformally forming a first nucleation layer on the first barrier layer; performing a post-treatment to the first nucleation layer, wherein the post-treatment includes a reducing agent including diborane and a tungsten-containing precursor; forming a first bulk layer on the first nucleation layer, wherein the first nucleation layer and the first bulk layer configure a first conductive layer; and performing a planarization process to turn the first insulating layer, the first barrier layer, and the first conductive layer into a word line insulating layer, a word line barrier layer, and a word line conductive layer, respectively and correspondingly, wherein the word line insulating layer, the word line barrier layer, and the word line conductive layer configure a word line structure. The first nucleation layer and the first bulk layer include tungsten.

Due to the design of the method for fabricating the semiconductor device of the present disclosure, the word line conductive layer 230 may have tungsten with greater grain size and improved resistivity by employing the post-treatment to the nucleation portion 231 of the word line conductive layer 230. In addition, the resistivity of the word line conductive layer 230 may be improved by using the word line intervening layer 250 formed of amorphous tungsten silicide to avoid the adverse columnar grain structure effect of the word line barrier layer 220.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a substrate;
    forming a word line trench in the substrate;
    conformally forming a first insulating layer in the word line trench and conformally forming a first barrier layer on the first insulating layer;
    conformally forming a first nucleation layer on the first barrier layer;
    performing a post-treatment to the first nucleation layer, wherein the post-treatment comprises a reducing agent comprising diborane and a tungsten-containing precursor;
    forming a first bulk layer on the first nucleation layer, wherein the first nucleation layer and the first bulk layer configure a first conductive layer; and
    performing a planarization process to turn the first insulating layer, the first barrier layer, and the first conductive layer into a word line insulating layer, a word line barrier layer, and a word line conductive layer, respectively and correspondingly, wherein the word line insulating layer, the word line barrier layer, and the word line conductive layer configure a word line structure;
    wherein the first nucleation layer and the first bulk layer comprise tungsten.

2. The method for fabricating the semiconductor device of claim 1, wherein performing the post-treatment to the first nucleation layer comprising:
    alternatively exposing the first nucleation layer to pulses of the reducing agent and pulses of the tungsten-containing precursor with interval times between the pulses of the reducing agent and the pulses of the tungsten-containing precursor.

3. The method for fabricating the semiconductor device of claim 2, wherein the tungsten-containing precursor comprises tungsten hexafluoride, tungsten hexachloride, or tungsten hexacarbonyl.

4. The method for fabricating the semiconductor device of claim 3, wherein no intervening pulse is performed during the interval times.

5. The method for fabricating the semiconductor device of claim 4, wherein a flow rate of the reducing agent is between about 100 standard cubic centimeters per minute and about 500 standard cubic centimeters per minute.

6. The method for fabricating the semiconductor device of claim 5, wherein a flow rate of the tungsten-containing precursor is between about 100 standard cubic centimeters per minute and about 500 standard cubic centimeters per minute.

7. The method for fabricating the semiconductor device of claim 6, wherein the post-treatment is performed at a process pressure between about 2 Torr and about 100 Torr.

8. The method for fabricating the semiconductor device of claim 2, wherein a pulse time of one of the pulses of the reducing agent is between about 0.5 seconds and about 5 seconds.

9. The method for fabricating the semiconductor device of claim 7, wherein a total number of the pulses of the reducing agent and the pulses of the tungsten-containing precursor is between 2 and 8.

10. The method for fabricating the semiconductor device of claim 8, wherein a duration of one of the interval times is between about 2 seconds and about 5 seconds.

11. The method for fabricating the semiconductor device of claim 1, wherein a duration of the post-treatment is between about 10 seconds and about 30 seconds.

12. The method for fabricating the semiconductor device of claim 1, further comprising forming a word line intervening layer between the word line conductive layer and the word line barrier layer;
    wherein the word line intervening layer comprises amorphous tungsten silicide.

* * * * *